United States Patent [19]

Burns

[11] Patent Number: 5,631,193
[45] Date of Patent: *May 20, 1997

[54] HIGH DENSITY LEAD-ON-PACKAGE FABRICATION METHOD

[75] Inventor: Carmen D. Burns, Austin, Tex.

[73] Assignee: Staktek Corporation, Austin, Tex.

[*] Notice: The term of this patent shall not extend beyond the expiration date of Pat. No. 5,369,056.

[21] Appl. No.: 497,565

[22] Filed: Jun. 30, 1995

Related U.S. Application Data

[63] Continuation of Ser. No. 990,334, Dec. 11, 1992, Pat. No. 5,484,959.

[51] Int. Cl.⁶ .......................... H01L 21/302; H05K 3/30
[52] U.S. Cl. ................... 29/827; 29/841; 438/118
[58] Field of Search .......................... 29/825, 827, 841; 257/666, 669, 675, 676, 787, 788, 706, 712, 713, 717; 437/220, 224, 225; 174/52.1, 52.2, 52.3, 52.4

[56] References Cited

U.S. PATENT DOCUMENTS

| | | | |
|---|---|---|---|
| 3,436,604 | 4/1969 | Hyltin et al. | 317/101 |
| 3,614,546 | 10/1971 | Avins | 174/234 R |
| 3,713,893 | 1/1973 | Shirland | 437/205 X |
| 3,727,064 | 4/1973 | Bottini | 250/217 |
| 3,739,462 | 6/1973 | Hasty | 29/577 |
| 3,925,801 | 12/1975 | Haitz et al. | 357/19 |
| 4,103,318 | 7/1978 | Schwede | 361/388 |
| 4,158,745 | 6/1979 | Keller | 361/421 |
| 4,241,493 | 12/1980 | Andrulits et al. | 437/209 X |
| 4,288,841 | 9/1981 | Gogal | 361/414 |
| 4,321,418 | 3/1982 | Dran et al. | 264/102 X |
| 4,331,258 | 5/1982 | Geschwind | 220/359 |
| 4,437,235 | 3/1984 | McIver | 29/840 |
| 4,451,973 | 6/1984 | Tateno et al. | 29/588 |
| 4,521,828 | 6/1985 | Fanning | 174/52.4 |
| 4,525,921 | 7/1985 | Carson et al. | 29/577 |
| 4,630,172 | 12/1986 | Stenerson et al. | 361/386 |
| 4,633,573 | 1/1987 | Scherer | 29/589 |
| 4,680,617 | 7/1987 | Ross | 357/72 |
| 4,684,975 | 8/1987 | Takiar et al. | 357/70 |

(List continued on next page.)

FOREIGN PATENT DOCUMENTS

| | | |
|---|---|---|
| 57-31166 | 2/1982 | Japan. |
| 58-96756A | 6/1983 | Japan. |
| 58-112348 | 7/1983 | Japan. |
| 61-163652 | 1/1985 | Japan. |
| 60-180150A | 9/1985 | Japan. |
| 63-153849 | 6/1988 | Japan. |

OTHER PUBLICATIONS

Dean Frew, "High Density Memory Packaging Technology High Speed Imaging Applications," *SPIE*, vol. 1346 *Ultra-high-and High-Speed Photography, Videography, Photonics, and Velocimetry '90*, pp. 200–209.

*Primary Examiner*—Bot L. Ledynh
*Attorney, Agent, or Firm*—Fulbright & Jaworski L.L.P.

[57] ABSTRACT

The present invention provides a method and apparatus for fabricating thermally and electrically improved electronic integrated circuits by laminating one or more lead frames to a standard integrated circuit package such as, for example, a thin small outline package (TSOP). The lead frame laminated to the package enhances thermal conduction of heat from the integrated circuit package. A heat spreader may also be utilized to improve heat transfer and can be further used as a ground plane to improve signal quality by reducing electrical circuit noise. Achieving improved thermal transfer characteristics from an integrated circuit package results in better dissipation of heat from the integrated circuit package and results in more reliable operation thereby. Using standard commercially available integrated circuit packages such as TSOP allows economical and rapid fabrication of thermally and electrically superior electronic circuits for applications that demand high reliability and performance. The method and apparatus of the present invention may be used for single integrated circuit packages or packages densely stacked into a three dimensional multi-package array.

8 Claims, 28 Drawing Sheets

U.S. PATENT DOCUMENTS

| | | | |
|---|---|---|---|
| 4,722,060 | 1/1988 | Quinn et al. | 364/490 |
| 4,733,461 | 3/1988 | Nakano | 29/830 |
| 4,763,188 | 8/1988 | Johnson | 357/74 |
| 4,796,078 | 1/1989 | Phelps, Jr. et al. | 174/5.24 |
| 4,821,148 | 4/1989 | Kobayashi et al. | 257/790 |
| 4,823,234 | 4/1989 | Konishi et al. | 174/52.2 |
| 4,829,403 | 5/1989 | Hardin | 174/52.2 |
| 4,833,568 | 5/1989 | Berhold | 361/383 |
| 4,839,717 | 6/1989 | Phy et al. | 357/74 |
| 4,855,868 | 8/1989 | Harding | 174/52.2 |
| 4,862,245 | 8/1989 | Pashby et al. | 357/70 |
| 4,862,249 | 8/1989 | Carlson | 357/80 |
| 4,878,106 | 10/1989 | Sachs | 257/706 |
| 4,884,237 | 11/1989 | Mueller et al. | 365/63 |
| 4,891,789 | 1/1990 | Quattrini et al. | 365/63 |
| 4,948,645 | 8/1990 | Holzinger et al. | 156/252 |
| 4,953,005 | 8/1990 | Carlson et al. | 357/80 |
| 4,953,060 | 8/1990 | Lauffer et al. | 361/388 |
| 4,994,411 | 2/1991 | Naito et al. | 437/217 |
| 4,997,517 | 3/1991 | Parthasarathi | 156/630 |
| 5,001,545 | 3/1991 | Kalfus et al. | 357/70 |
| 5,014,113 | 5/1991 | Casto | 357/70 |
| 5,016,138 | 5/1991 | Woodman | 361/381 |
| 5,041,015 | 8/1991 | Travis | 439/492 |
| 5,049,527 | 9/1991 | Merrick et al. | 437/220 |
| 5,057,906 | 10/1991 | Ishigami | 257/706 |
| 5,065,277 | 11/1991 | Davidson | 361/383 |
| 5,086,018 | 2/1992 | Conru et al. | 437/237 |
| 5,099,393 | 3/1992 | Bentlage et al. | 361/413 |
| 5,108,553 | 4/1992 | Foster et al. | 29/852 |
| 5,138,434 | 8/1992 | Wood et al. | 357/74 |
| 5,151,559 | 9/1992 | Conru et al. | 174/52.4 |
| 5,159,434 | 10/1992 | Kohno et al. | 357/80 |
| 5,214,845 | 6/1993 | King et al. | 29/841 |
| 5,221,642 | 6/1993 | Burns | 437/207 |
| 5,223,739 | 6/1993 | Katsumata et al. | 257/787 |
| 5,236,117 | 8/1993 | Roane et al. | 288/180.21 |
| 5,243,133 | 9/1993 | Engle et al. | 174/524 |
| 5,273,940 | 12/1993 | Sanders | 437/209 |
| 5,279,029 | 1/1994 | Burns | 29/856 |
| 5,307,929 | 5/1994 | Seidler | 206/331 |
| 5,367,766 | 11/1994 | Burns et al. | 29/848 |
| 5,369,056 | 11/1994 | Burns et al. | 437/209 |
| 5,369,058 | 11/1994 | Burns et al. | 437/209 |
| 5,371,866 | 12/1994 | Cady | 395/400 |
| 5,377,077 | 12/1994 | Burns | 361/704 |
| 5,420,751 | 5/1995 | Burns | 361/707 |

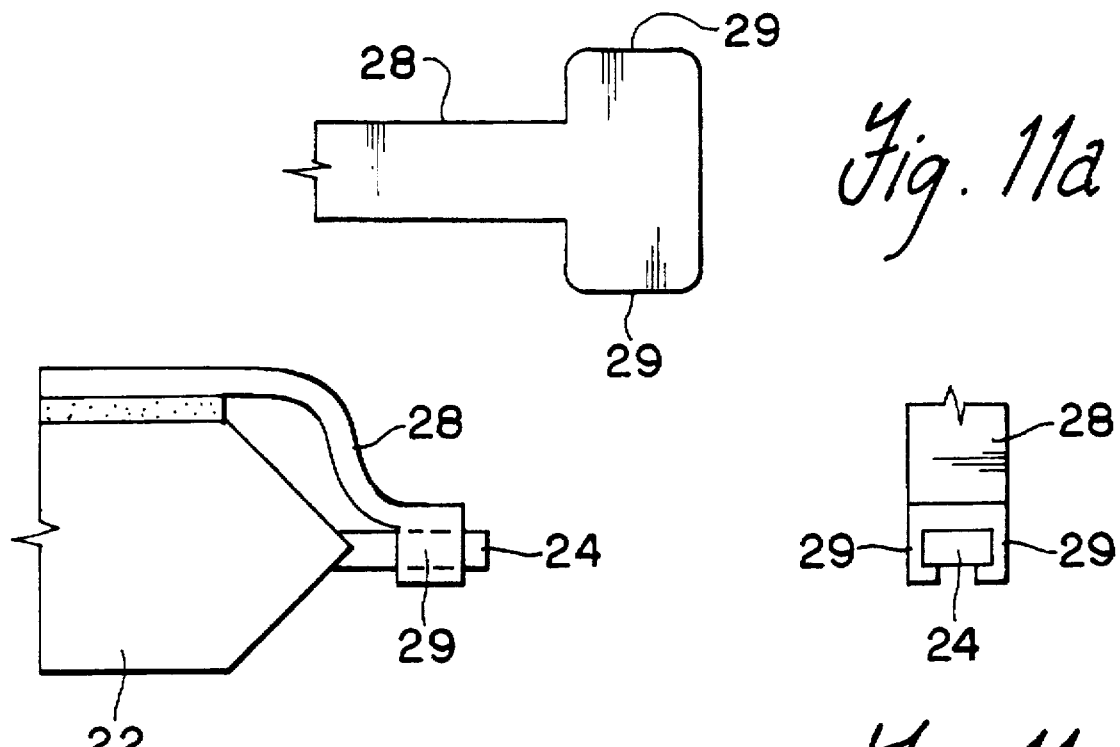
Fig. 11a
Fig. 11b
Fig. 11c
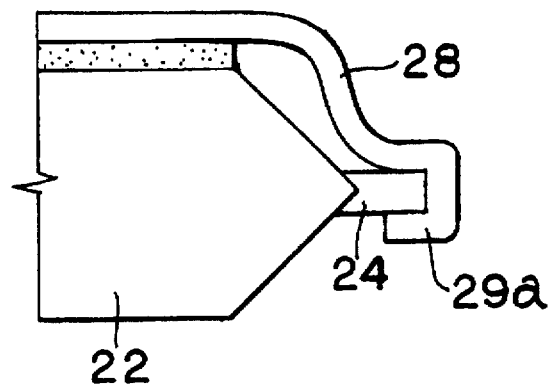
Fig. 12

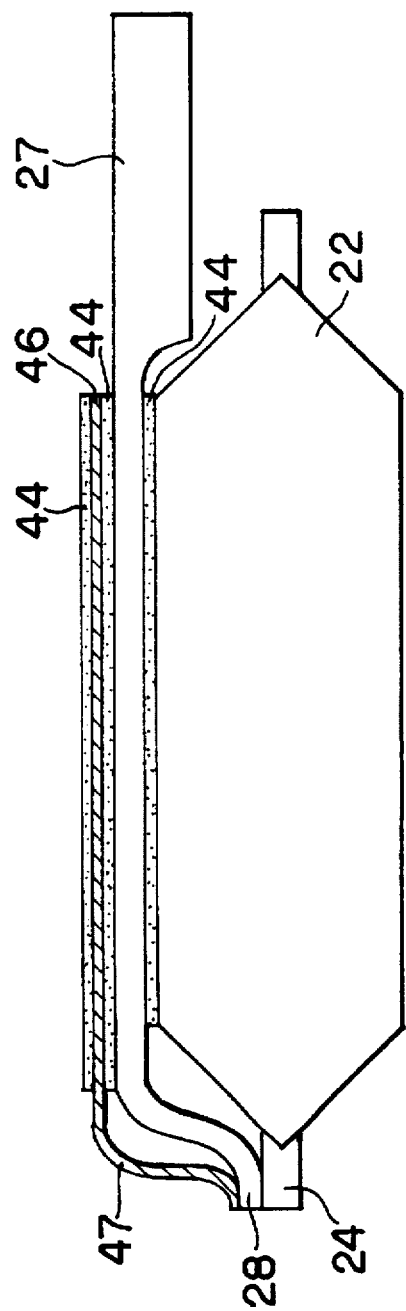
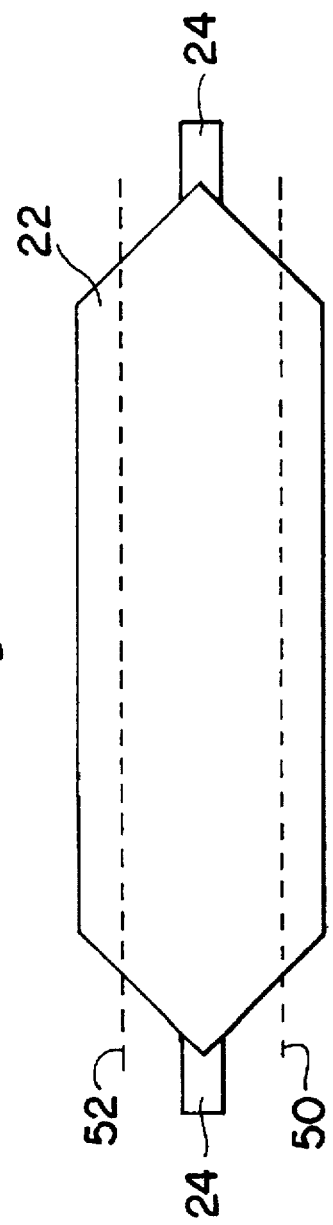

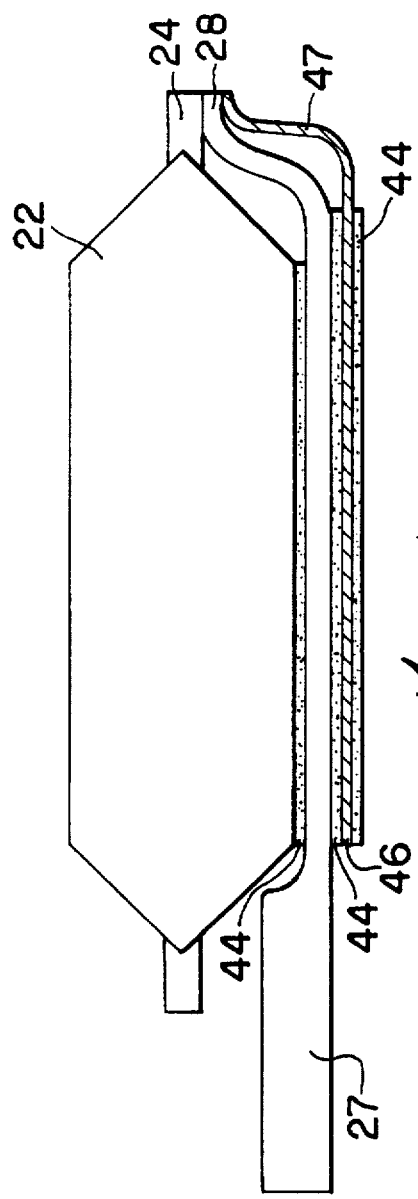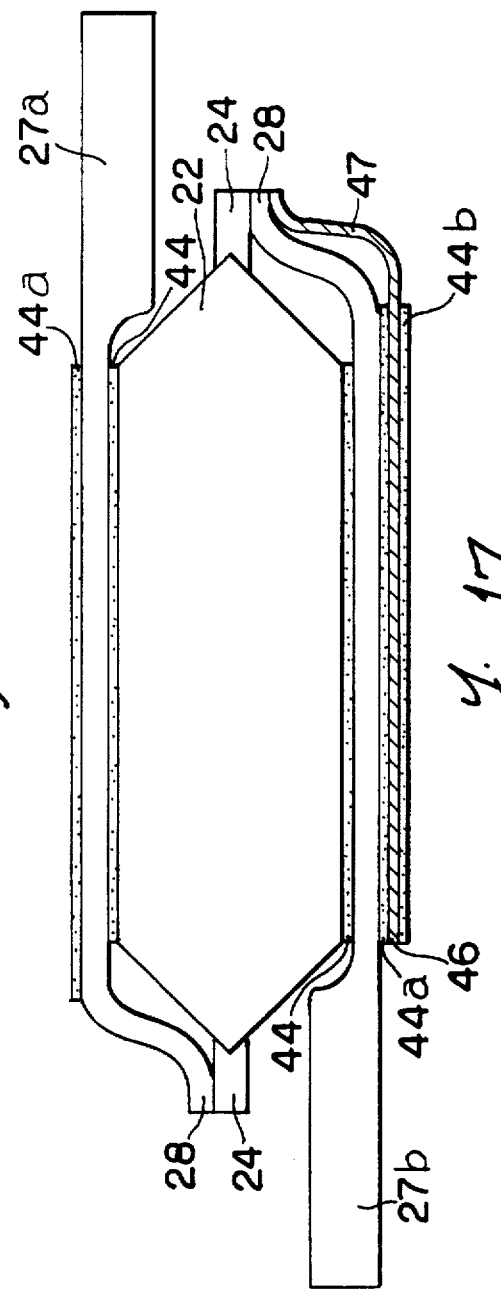

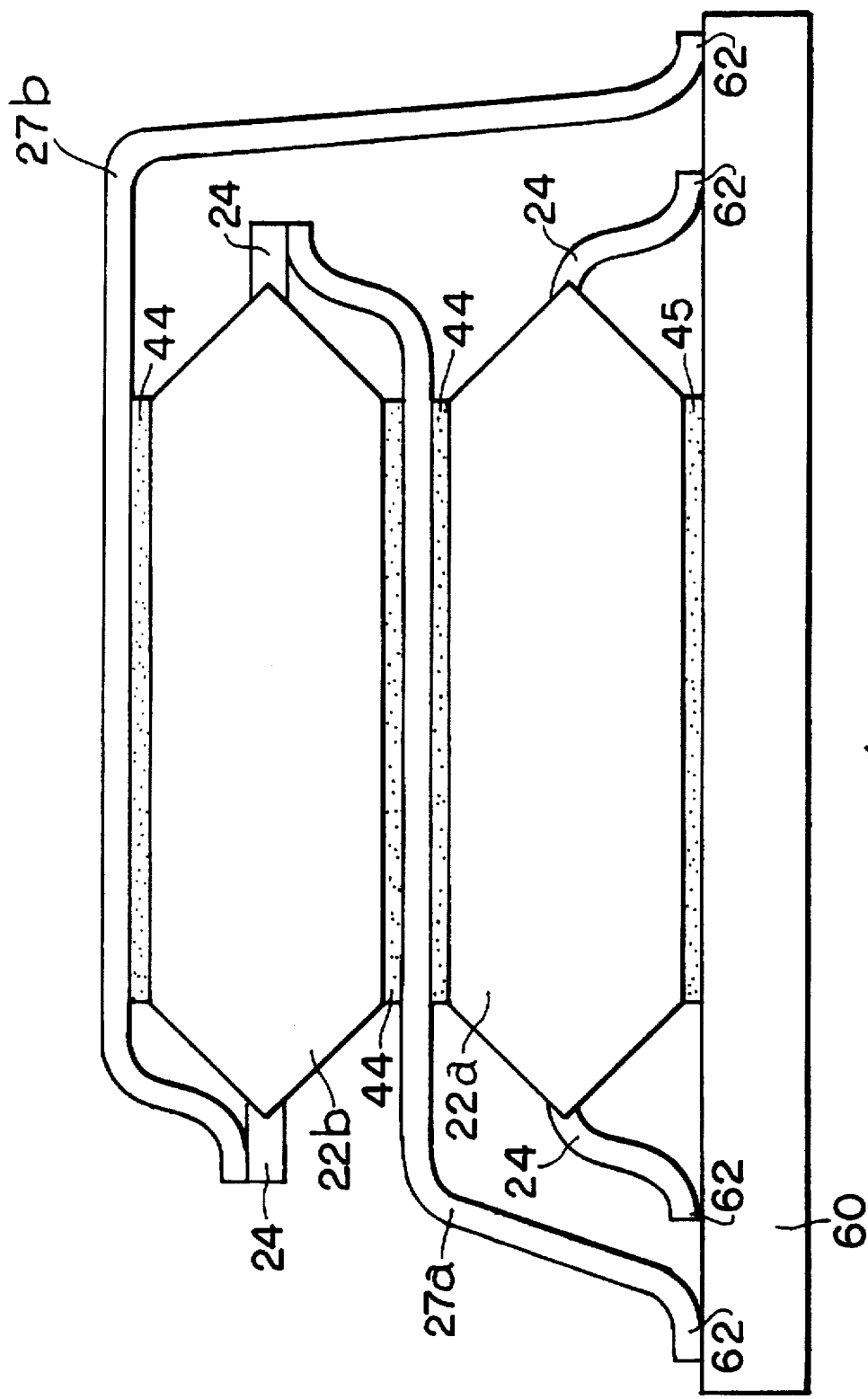

HIGH DENSITY LEAD-ON-PACKAGE FABRICATION METHOD

The present application is a continuation of patent application Ser. No. 07/990,334, filed Dec. 11, 1992, U.S. Pat. No. 5,484,959.

BACKGROUND OF THE INVENTION

1. Field of the Invention

This invention relates to a novel construction of an integrated circuit package and a method for fabricating the same. In particular, the invention relates to forming an improved package particularly suited for multiple-unit three-dimensional stacking. This improved package is fabricated by attaching a lead frame to an integrated circuit package in a manner that results in improved thermal transfer of heat from within the integrated circuit package and provides additional electrical conductors useful with addressing and communicating multiple package modules.

2. Discussion of the Related Technology

Packaging techniques for integrated circuits have been developed in the past in an attempt to satisfy demands for miniaturization in the semiconductor industry. Improved methods for miniaturization of integrated circuits enabling the integration of millions of transistor circuit elements into single integrated silicon embodied circuits, or chips, have resulted in increased emphasis on methods to package these circuits in space efficient, yet reliable and mass producible packages.

Integrated circuits are created from a silicon wafer using various etching, doping and depositing steps that are well know in the art of fabricating integrated circuit devices. A silicon wafer may be comprised of a number of integrated circuit dies that each represent a single integrated circuit chip. Ultimately, the chip may be packaged by using a lead frame connected to the electrical circuit connection pads of the chip, supported in and passing through the plastic encasement around the chip to be further connected to a variety of external pin-out or mounting and interconnection schemes.

The lead frame extends beyond the encapsulating package and is used to connect the electrical circuits contained within the chip to the electronic system connection means, such as a printed circuit board. Typical molded case integrated circuit packages include, for example, M-Dip (Dual-In-Line-Plastic), SIP (Single-In-Line-Plastic), PLCC (Plastic Leaded Chip Carrier), SOJ (Small Outline J-leaded) and TSOP (Thin Small Outline Package) molded case packages.

Operating electronic circuits generate heat. The amount of heat generated depends on the circuit complexity, speed and power requirements. Thus, the requirement for adequate heat dissipation increases with greater circuit complexity (number of transistors) and operating speeds. This heat must be dissipated from within the integrated circuit package by thermal convection or conduction cooling. Heat may be removed through thermal conduction from the package and lead frame by, for example, convective air flow around the package, conduction through the lead frame into the printed circuit board, and/or conduction through the package into a system heat sink.

In an attempt to configure electronic systems in ever smaller packages, new methods and apparatus comprising three dimensional stacked integrated circuit packages have been developed as more fully described in U.S. patent application Ser. Nos. 07/561,417 and 07/884,066, filed Aug. 1, 1990 and May 15, 1992, respectively, both having the common assignee of the present invention and incorporated herein by reference for all purposes. Such multiple package modules pose an even greater need for heat dissipation and further typically require more circuit pin-outs or leads to address and communicate between the individual packages and external circuitry.

A method and apparatus to efficiently remove heat from the integrated circuit die encapsulated within the integrated circuit package is needed that is both reliable and easy to mass produce. When the thermal conduction from the integrated circuit package is improved, the junction temperatures of the transistors of the integrated circuit chip within the package are lowered, thus, improving the reliability of the integrated circuit package. In addition, an improved thermally conductive individual package may be used in a higher thermal density application without degradation in overall performance or reliability.

An example of a hermetically sealed ceramic integrated circuit heat dissipating package having improved thermal dissipation characteristics is more fully described in co-pending U.S. patent application Ser. No. 07/905,587, filed Jun. 26, 1992, having the common assignee of the present invention and incorporated herein by reference for all purposes. An example of a fabrication method and apparatus for lead-on-chip integrated circuits having improved thermal dissipation characteristics is more fully described in co-pending U.S. patent application Ser. No. 07/746,268, filed Aug. 15, 1991 and Patent Cooperative Treaty International application No. PCT/US92/06778, both having the common assignee of the present invention and incorporated herein by reference for all purposes. There are, however, integrated circuit packages in commercial production such as, for example, the TSOP type whose thermal transfer characteristics could be improved upon after manufacture by modifying such packages in accordance with the present invention, thus allowing greater integrated circuit packaging densities and improved reliability.

SUMMARY OF THE INVENTION

The present invention provides a method for fabricating modified integrated circuit packages from standard integrated circuit packages to provide enhanced thermal conductivity and improved signal quality by reducing electrical noise. Achieving improved thermal transfer characteristics from an integrated circuit package results in better heat dissipation and more reliable operation. Using standard commercially available integrated circuit packages such as TSOP allows economical and rapid fabrication of thermally and electrically superior electronic circuits for applications that demand high reliability and performance. Furthermore, the modification provided by the present invention greatly facilitates use of the modified package in a multi-unit, stacked three-dimensional module by providing additional facility for electrical interconnections useful for addressing of and communication with the individual packages.

The present invention discloses a novel manufacturing process for assembling integrated circuit packages in a cost effective and simple to use assembly process. One way to increase space efficiency and improve the performance of electronic equipment is to stack integrated circuit packages closely together. More integrated circuit packages may be stacked in a given space if the integrated circuit packages used are thin small outline packages (TSOP). However, as in all higher density packaging techniques, higher density generates more heat in a given package and thus increases the need for efficient heat dissipation.

In order to achieve the thinnest package possible, the various layers used to construct the integrated circuit package must be minimized in thickness and number. The present invention aids in obtaining a thin heat dissipating integrated circuit package by reducing to a minimum the number of layers and the thickness of each layer when attaching a lead frame to an integrated circuit package.

In the method of the present invention, at least one thermally and electrically conductive lead frame is laminated or mounted in heat exchange relationship onto at least one major exterior surface of an integrated circuit package by using a very thin layer of adhesive. Additionally, using the method of the present invention reduces the overall thickness of the integrated circuit package and/or lead frame which results in improved heat transfer. Lead frames typically are from about 1.4 mils to over 8 mils thick. Reduction in package thickness can be obtained by selectively etching or stamping portions of the lead frame overlaying the package to approximately half original thickness.

The preferred embodiment of the present invention utilizes a TSOP integrated circuit package that may be additionally lapped or ground thinner, a layer of adhesive approximately 0.3 mils thick and a metal lead frame approximately 3 mils thick. The lead frame may be etched to approximately 1.5 mil thickness in the area where it is attached to the integrated circuit package. The lead frame may be soldered or thermal compression bonded to the leads which typically protrude along one or more perimeter edges of the TSOP package. A TSOP integrated circuit may be configured as a type 1 having integral package leads along the short sides of the package or as a type 2 having integral package leads along the long sides of the package.

A further embodiment of the present invention provides a thermally conductive heat spreader over the lead frame attached to the integrated circuit package. A thin layer of adhesive is used to laminate or attach the heat spreader to the lead frame in a heat exchange relationship and also electrically, but not thermally, insulate the lead frame from the heat spreader. The heat spreader, if electrically conductive, may also be used as a signal ground plane to reduce noise and improve signal integrity on the lead frame. The heat spreading ground plane may be positioned between the face of the IC chip and the lead frame or over the lead frame. Alternatively, two ground planes can be provided, one above and one below.

The configuration of the present invention also provides the ability to control the impedance of the lead frame by selecting appropriate lead frame dimensions and spacing between the lead frame and heat spreader or ground plane. This, in turn, provides improved high frequency operation of the IC devices. The ground plane and lead frame conductors may form either a stripline or microstrip system when using one or two ground planes, respectively. Design of stripline and microstrip systems are well known in the radio frequency arts.

Use of ground planes to reduce IC circuit noise and/or to control signal impedances allows faster operating speeds of ICs such as static random access memory (SRAM) and dynamic random access memory (DRAM). Both SRAM and DRAM are used to store digital data and are sensitive to system noise and signal settling times. Signal settling time is the time required for a signal to obtain a stable state without noise present such as ringing or standing wave reflections. Both of these noise types result from impedance mismatching in a high frequency signal system.

Ground induced noise may also be present because of inadequate conductor size. High frequency currents resulting from rapid switching speeds tend to travel only on the surface of a metal conductor, a phenomena known as the "skin effect." By enlarging the surface area of conductors required to carry large and rapidly varying ground currents, ground noise due to charging and discharging circuit capacitance when switching logic states is greatly reduced.

A TSOP integrated circuit contains an integrated circuit chip attached to an internal lead frame which are encapsulated with material such as epoxy. A feature of the present invention is to make the TSOP thinner by grinding or lapping the encapsulating material. A thinner TSOP, however, may warp during fabrication or use. To prevent warping while still maintaining a thin profile, the package of the present invention may include a thin stiffener laminated to a major face of the TSOP. The stiffener may be, for example, a thin, planer metal element formed of kovar, invar, invar coated copper, copper, or other suitable materials.

For example, when a TSOP of approximately 40 mils nominal thickness has a single lead frame of 3 mils or less in thickness laminated thereto at 175 degrees centigrade, at room temperature the TSOP warpage may be approximately 0.5 mil. This amount of warpage may be acceptable. Where a thicker lead frame, for example, 4–6 mils is used, a stiffener may be required. The stiffener may be 1–3 mils thick, the adhesive that laminates the stiffener to the TSOP may be 0.3 mils thick and an insulating polymer coating over the stiffener may be 1 rail thick.

An insulating polymer coating may be placed over the lead frame, heat spreader, ground plane, or stiffener to insulate conductive parts of the integrated circuit package of the present invention when stacking a plurality of packages together. This allows for extremely compact packing densities in a level II package as more fully described in co-pending U.S. patent application Ser. No. 07/561,417 by Burns. This packaging allows closely spacing integrated circuit packages and adequate heat dissipation.

The above embodiments of the present invention improve the thermal conductivity between the integrated circuit package and the lead frame, whether used with relatively thick encapsulated IC packages or the new TSOP thin packages. The present invention improves packaging density, electrical noise suppression and heat dissipation characteristics resulting in a smaller density package having higher power dissipation and lower electrical noise.

Other and further objects, features and advantages will be apparent from the following description of the presently preferred embodiment of the invention, given for the purpose of disclosure and taken in conjunction with the accompanying drawings.

BRIEF DESCRIPTION OF THE DRAWINGS

FIGS. 11, 12 and 13 are schematic plan and elevational views of embodiments of the present invention illustrating mechanical connection means;

FIG. 14 is a schematic elevational view of an embodiment of the present invention illustrating a metal heat spreader/ground plane on top of the integrated package;

FIG. 15 illustrates in schematic elevational view a TSOP integrated circuit before and after lapping or grinding, respectively, to make the TSOP thinner;

FIG. 16 is a schematic elevational view of an embodiment of the present invention illustrating a metal heat spreader/ground plane on the bottom of the integrated package;

FIG. 17 is a schematic elevational view of an embodiment of the present invention illustrating top and bottom lead flames and metal heat spreader/ground plane on the bottom lead frame;

FIGS. 18a and 18b are schematic elevational views of the present invention illustrating a multiple integrated circuit package embodiment of the present invention connected to a printed circuit board;

DETAILED DESCRIPTION OF THE PREFERRED EMBODIMENT

A better understanding of the present invention will be obtained when the following detailed description is read with reference to the drawings wherein common elements are designated with like numbers or letters and similar elements are designated with like numbers followed by a lower case letter.

Figure 1:
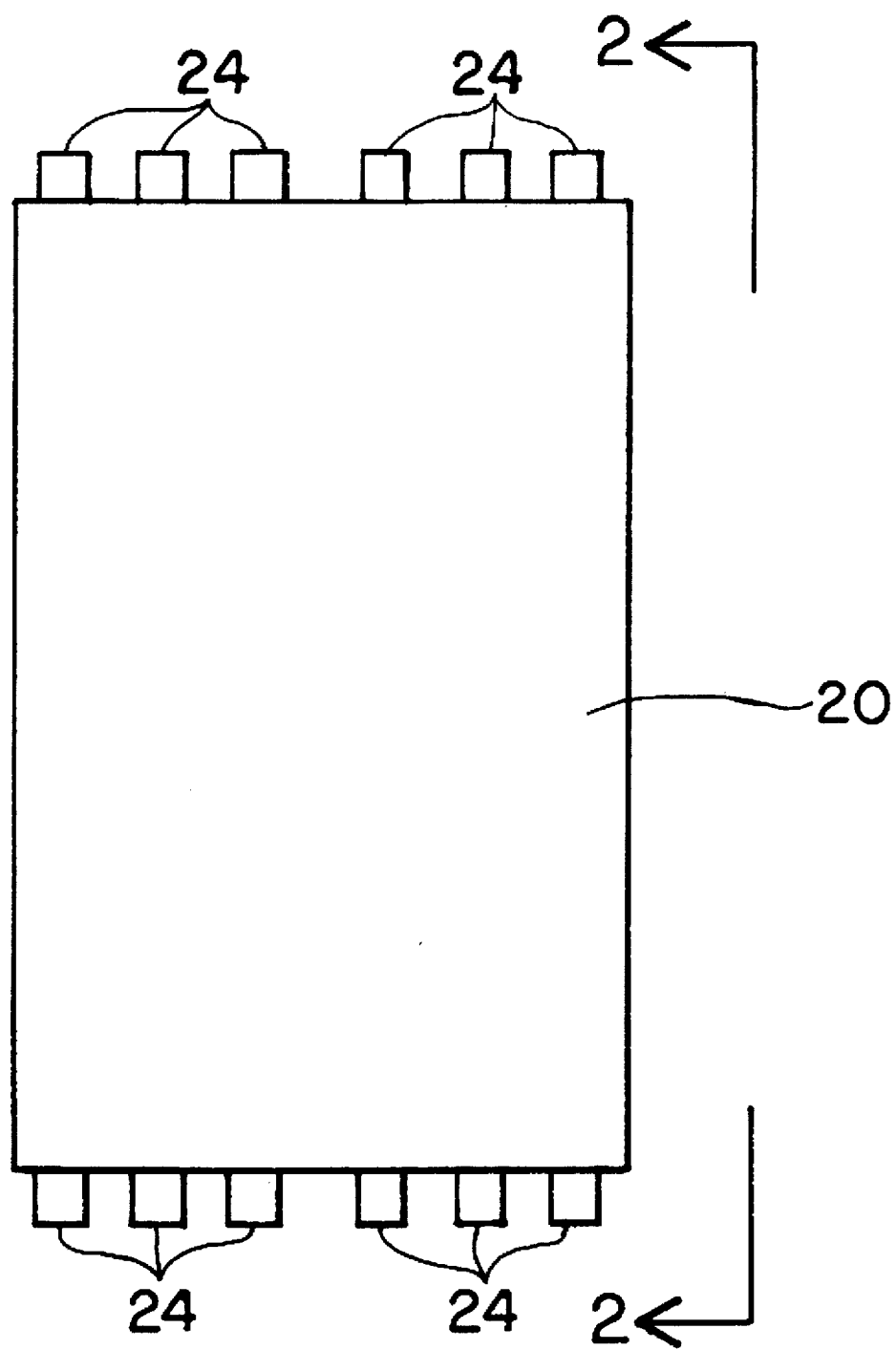
FIG. 1 illustrates a schematic plan view of a type 1 thin small outline package (TSOP)
Figure 2:
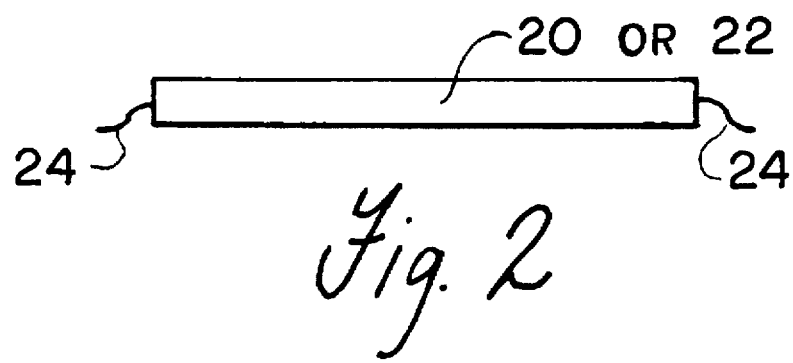
FIG. 2 is a schematic elevational view of FIGS. 1 or 3 taken along section line 2—2.
Figure 3:
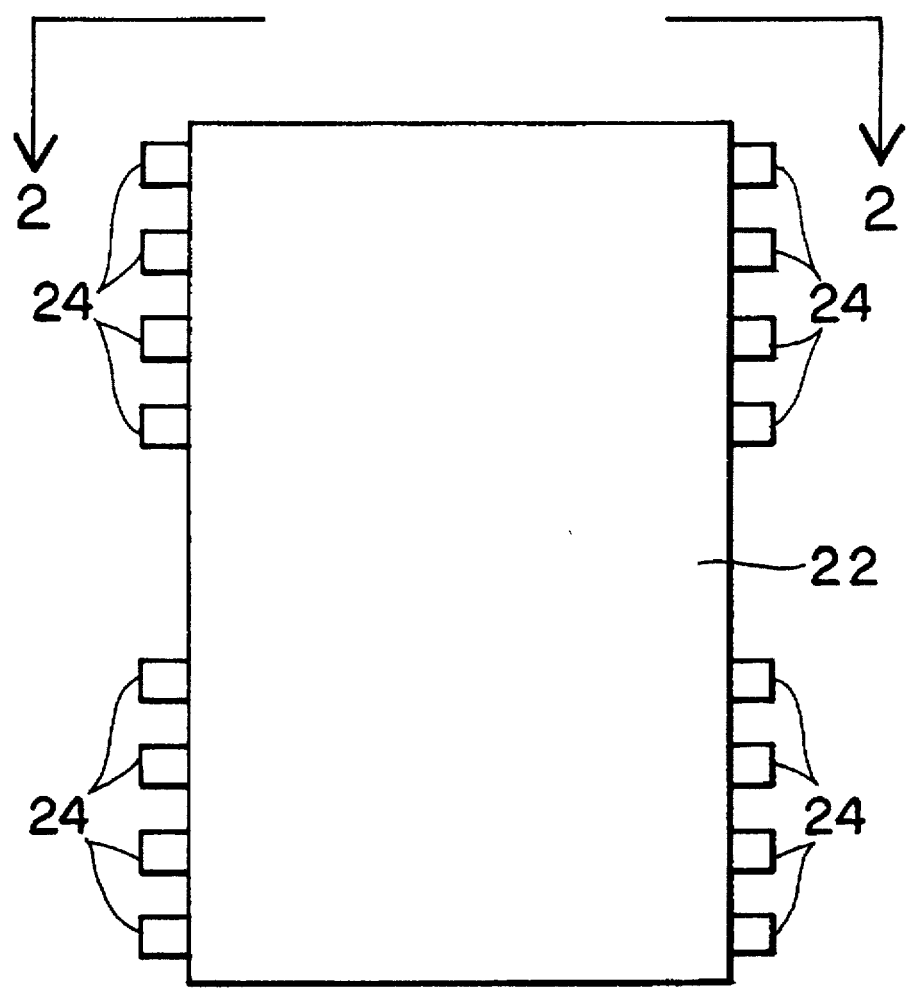
FIG. 3 is a schematic plan view of a type 2 thin small outline package (TSOP)

Referring now to FIG. 1, a type 1 thin small outline package (TSOP) integrated circuit package 20 is illustrated in schematic plan view. Package 20 has/connections 24 on the short sides of the package 20. Connections 24 conduct power, ground and signals to and from an IC chip (not illustrated) contained within the package 20. FIG. 3 illustrates a type 2 thin small outline package (TSOP) integrated circuit package 22. Package 22 has connections 24 on the long sides of the package 22. FIG. 2 illustrates a schematic elevational view of the TSOP packages of FIGS. 1 and 3.

Figure 4:
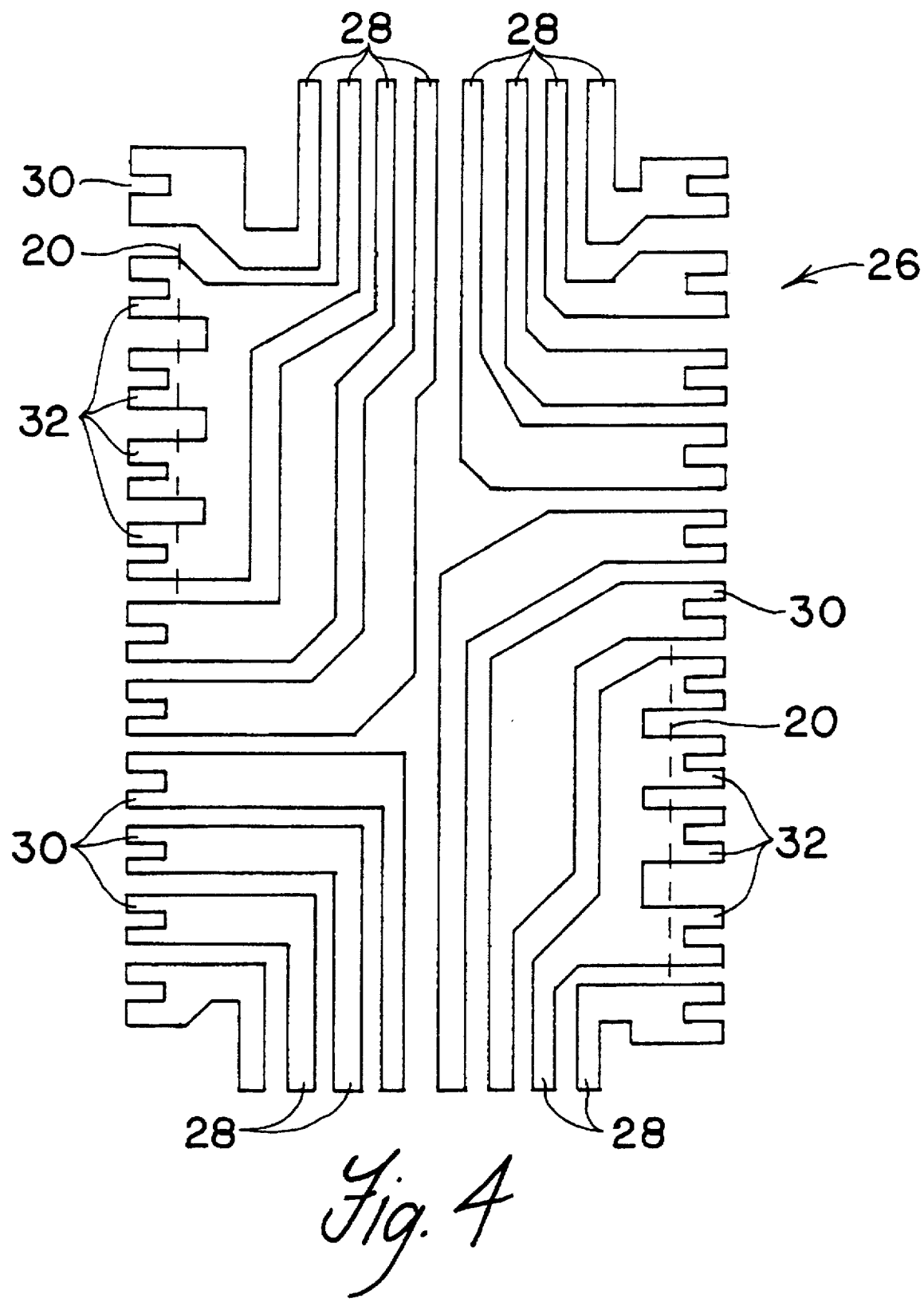
FIG. 4 is a schematic plan view of a lead frame used with the type 1 TSOP of FIG. 1.

Referring now to FIG. 4, a lead frame 26 for a type 1 TSOP package is schematically illustrated in plan view. Lead frame 26 may differ in layout and routing of the conductive paths across a major surface of the package 20. Various combinations of conductive path layout and interconnections of the lead frame conductors are readily apparent to those skilled in the art of integrated circuit fabrication and interconnections thereto. The lead frame 26 is comprised of conductors 28 which connect to the TSOP lead connections 24 (FIG. 1) and conduct the signals, power and ground to system connections 30 and selectable system connections 32. System connections 30 connect the signals, power and ground from conductors 28 to the electronic system (not shown).

In a similar fashion, selectable system connections 32 connect signals such as address select between the integrated circuit package 20 and the electrical system. A plurality of connections 32 are attached in a common signal bus and all but one of the connections 32 may be removed to selectively address the associated integrated circuit package 20. The one remaining connection 32 determines a predetermined address for selection of a circuit such as RAM.

Figure 5A:
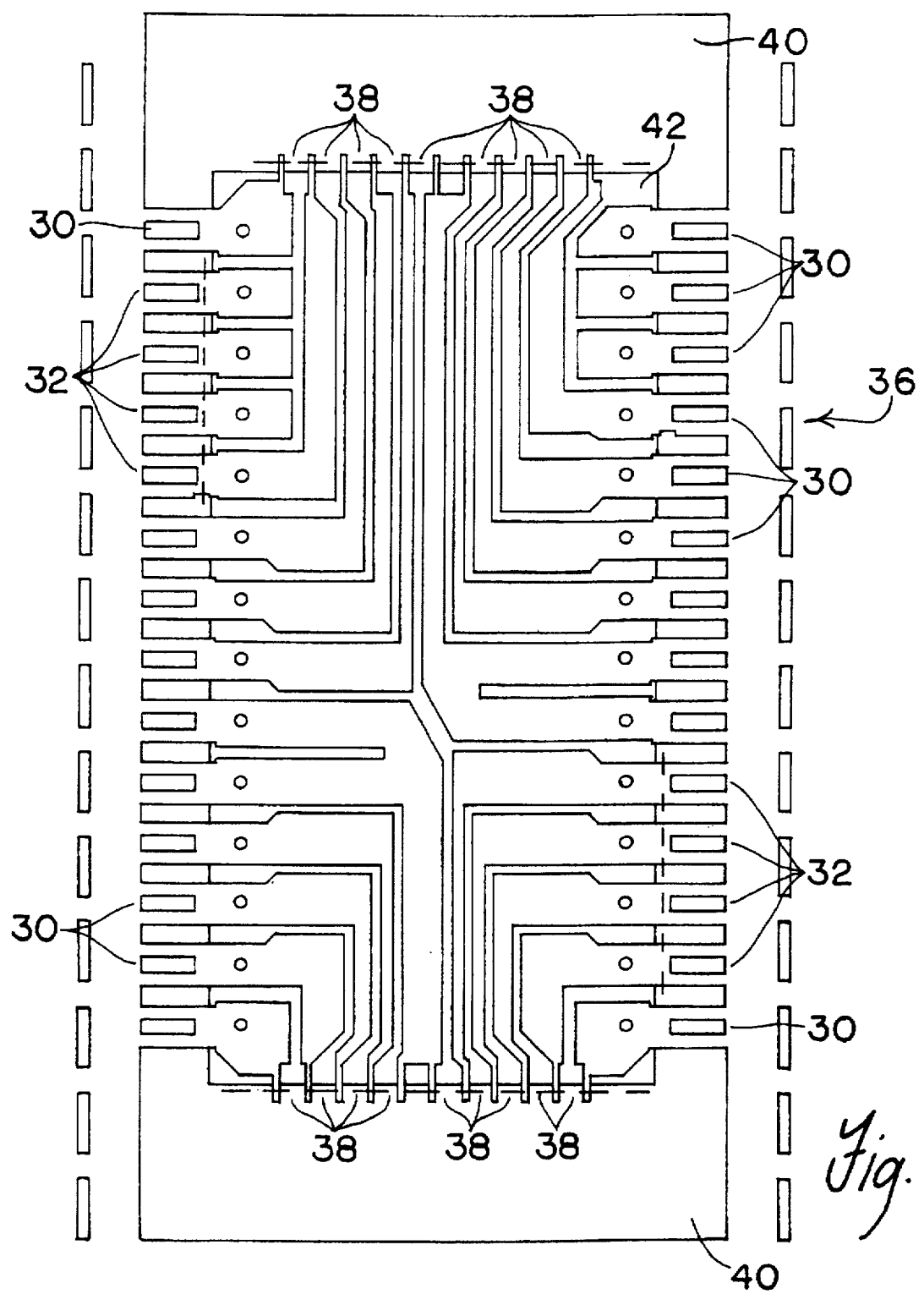
FIGS. 5a and 5b are schematic plan views of supported lead frames used with the type 1 TSOP of FIG. 1.
Figure 5B:
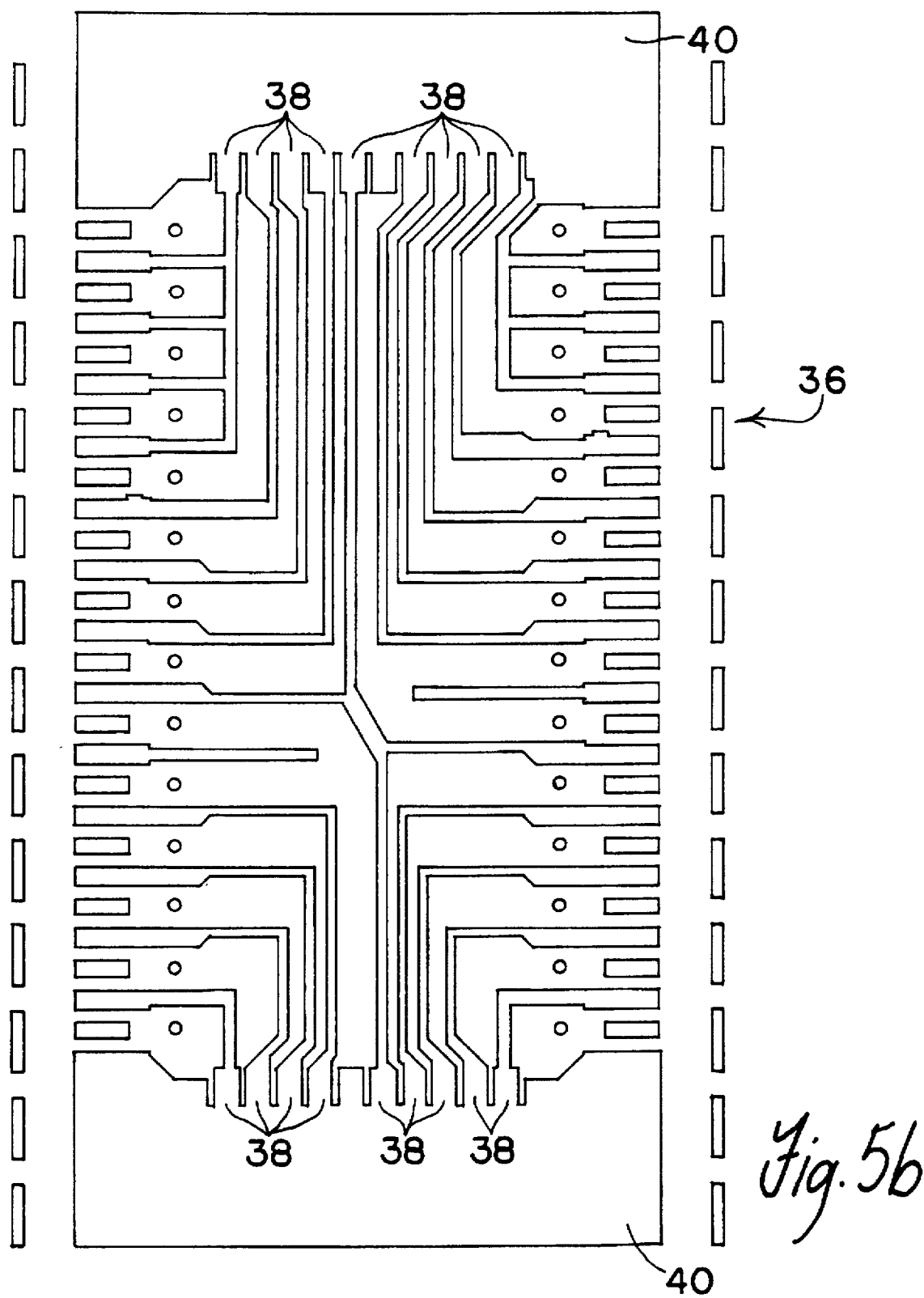

Referring now to FIGS. 5a and 5b, supported lead frames 36 for a type 1 TSOP package are schematically illustrated in plan view. Lead frame 36 serves the same purpose as the lead frame 26 of FIG. 4. The conductors 38 are temporarily supported by support bar 40 until an insulator 42 is laminated to the lead frame. The insulator may be, for example, a thin layer of Uplex with adhesive on both faces. The lead frame 36 is laminated to the insulator 42, and the insulator 42 structurally supports the ultra thin lead frame conductors 38 so the support bar 40 may be removed. After removal of the support bar 40, the lead frame 36 and insulator 42 may be laminated to the integrated circuit package 20.

The lead frames 26 and 36 illustrated in FIGS. 4, and 5a and 5b, respectively, are for exemplary purposes only and are not intended to restrict in any way the various combinations of useful interconnection to an integrated circuit package. Likewise, the present invention is applicable to various package types and is not limited to the TSOP package. For example, the lead frame 26 may comprise a flex circuit having an insulating layer between electrical conductors 28 so that the conductors 28 may cross over without shorting together. This cross over provides the heat dissipation advantages of the present invention for more complex circuits.

The lead frame conductors 28 connect to the TSOP connections 24 of package 20 by, for example, soldering or thermal compression bonding or other methods well known in the art. System connections 30 are used to connect the lead frame to external conductors such as system rails 70 (FIG. 16) when fabricating a level 2 Stakpak™ as more fully illustrated in co-pending U.S. patent application Ser. Nos. 07/561,417 and 07/884,066, filed Aug. 1, 1990 and May 15, 1992, respectively, and entitled "Ultra High Density Integrated Circuit Packages Method and Apparatus," incorporated herein by reference for all purposes. The connections 30 may have forked tongues as illustrated or may be configured in any fashion appropriate for connection to the system rails 70. Thermal strain relief may be incorporated into the lead frame structure (FIG. 28) so that minimal expansion or contraction forces are applied to the integrated circuit package during widely changing package temperatures.

Figure 6:
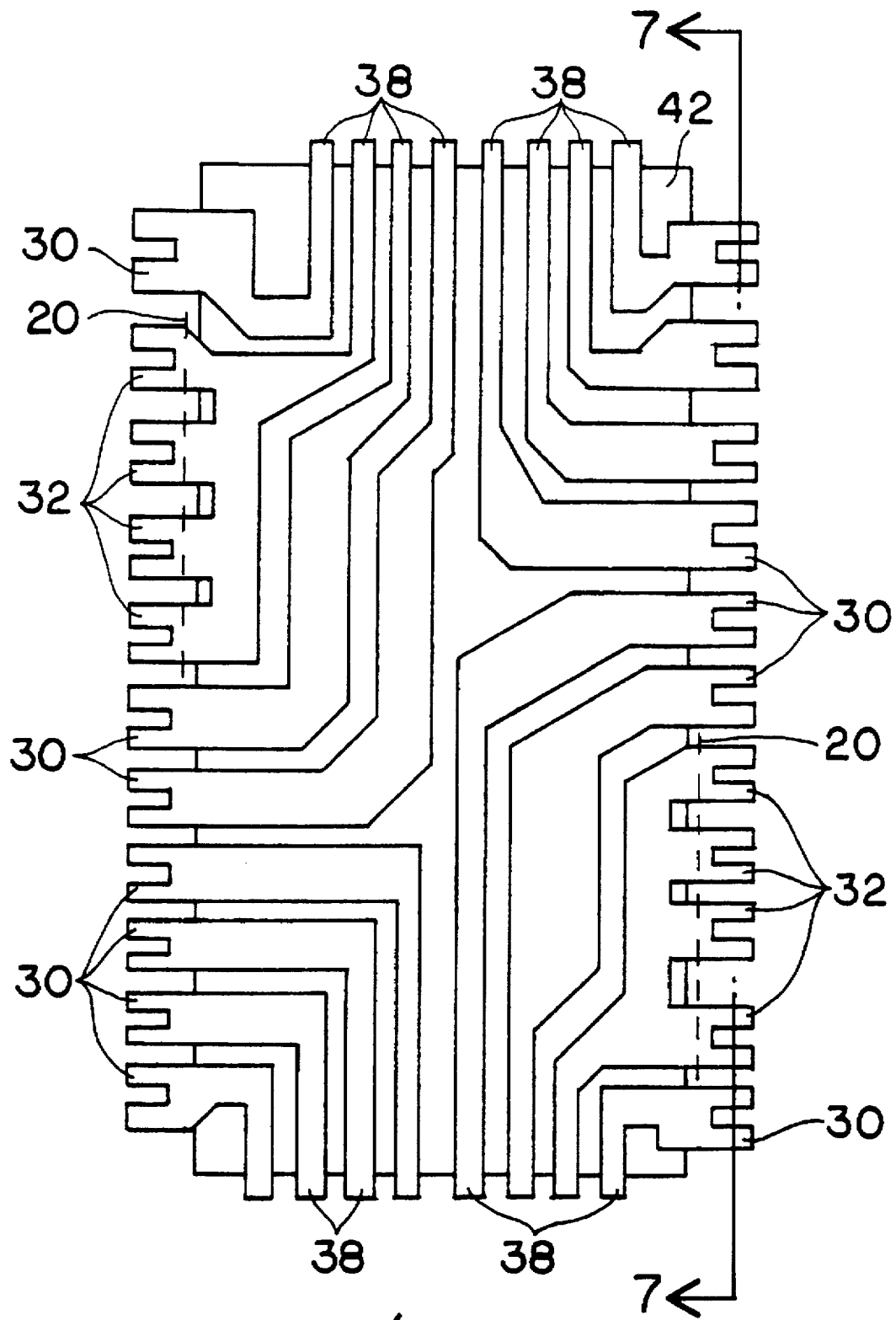
FIG. 6 is a schematic plan view of an embodiment of the present invention utilizing the lead frame of FIGS. 4 or 5.
Figure 7:
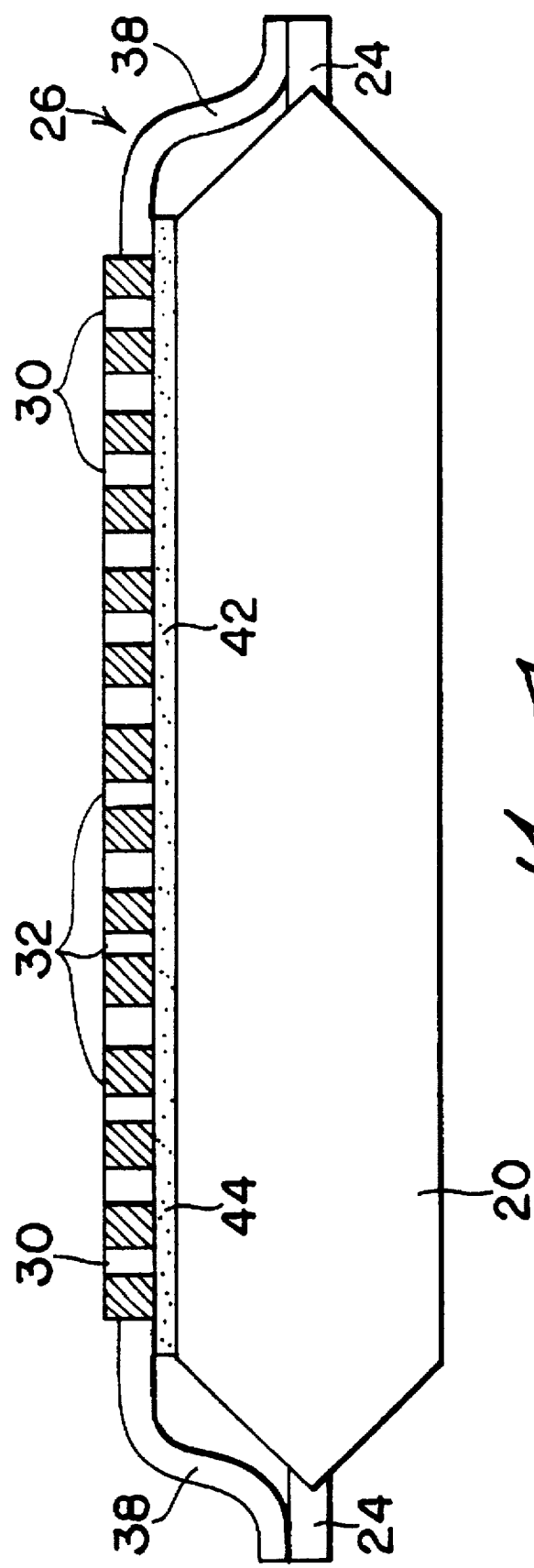
FIG. 7 is a schematic elevational view of FIG. 6 taken along section line 7—7.

Referring now to FIGS. 6 and 7, an embodiment of the present invention is illustrated in schematic plan and elevational views, respectively. The lead frame 26 or 36 of FIGS. 4 or 5, respectively, is laminated to the package 20 and connections thereto are made as described above. Conductors 38 are bent to contact TSOP connections 24 and are soldered or thermal compression bonded together.

Figure 8:
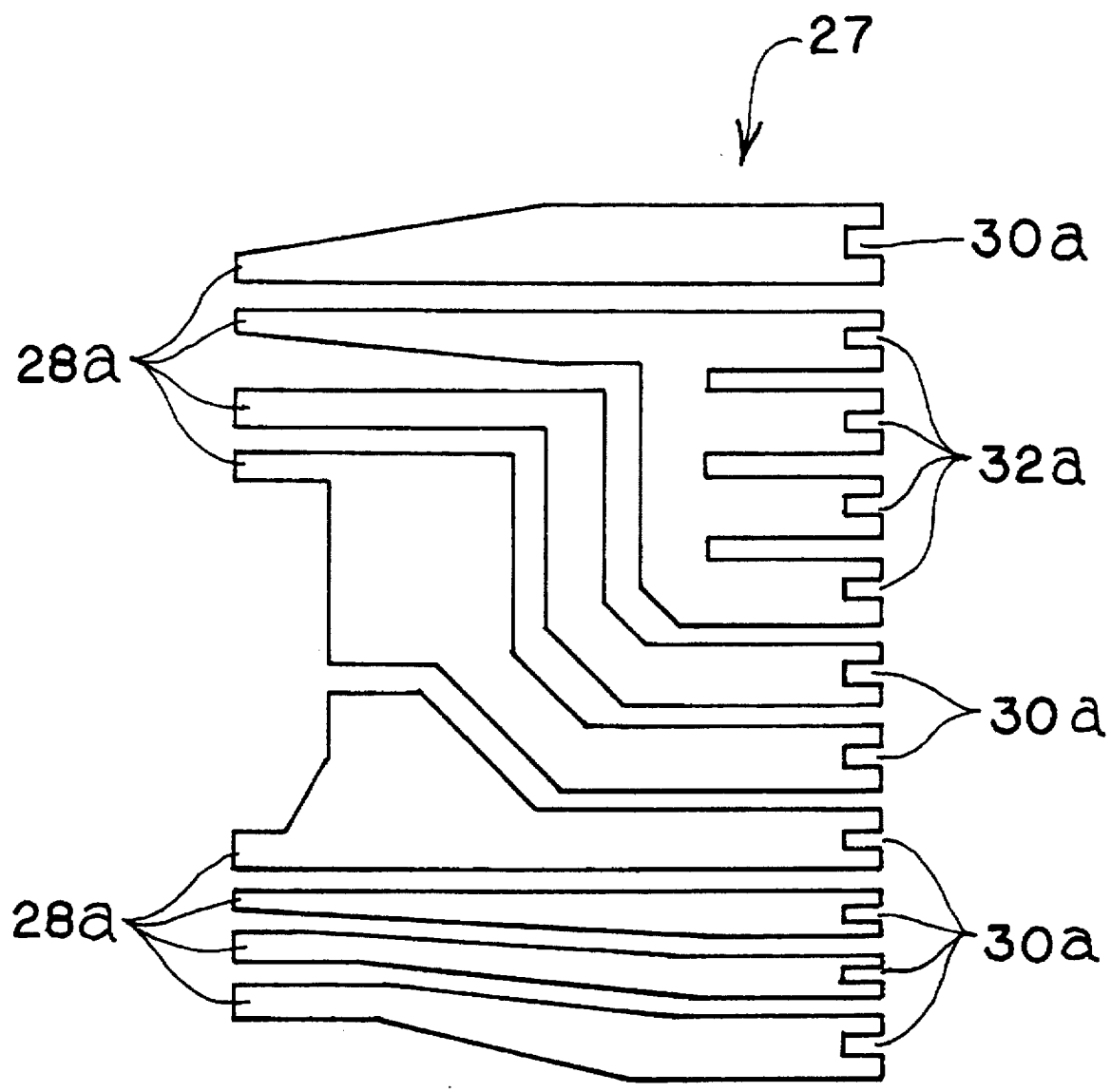
FIG. 8 is a schematic plan view of a lead frame used with a type 2 TSOP.
Figure 9:
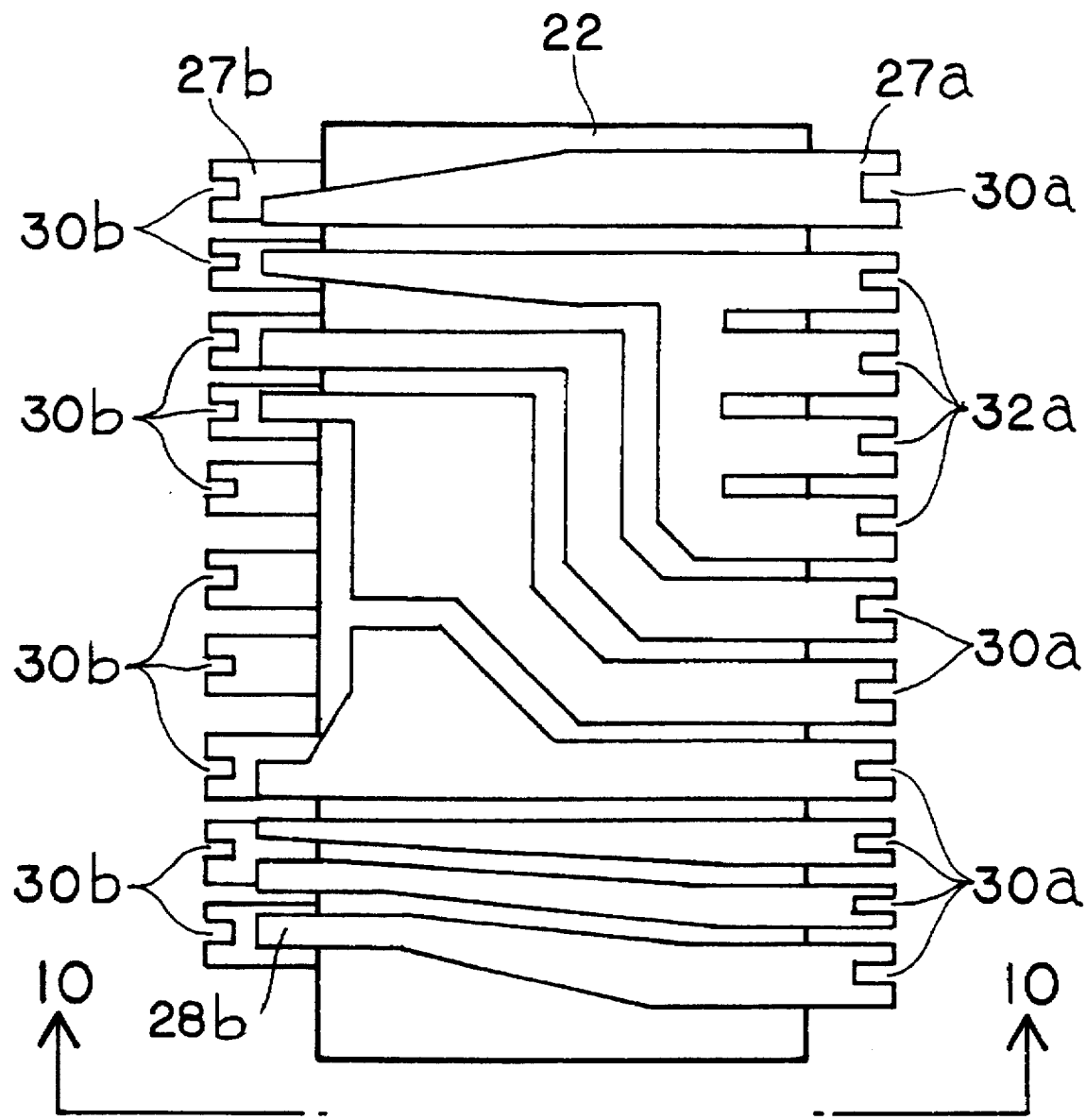
FIG. 9 is a schematic plan view of an embodiment of the present invention utilizing the lead frame of FIG. 8.

Referring now to FIGS. 8 and 9, a lead frame 27 and a type 2 TSOP package 22 having lead flames 27a and 27b mounted thereto, respectively, are schematically illustrated in plan view. This embodiment provides enhanced heat dissipation and a greater number of electrical connections from individual level-one packages therefor providing a level-one package that is suitable for vertical stacking in a three-dimensional level-two package. As mentioned above, the lead frame 27 is for exemplary purposes only and may vary in form and connection pattern as is well known to those skilled in the art.

Figure 10:
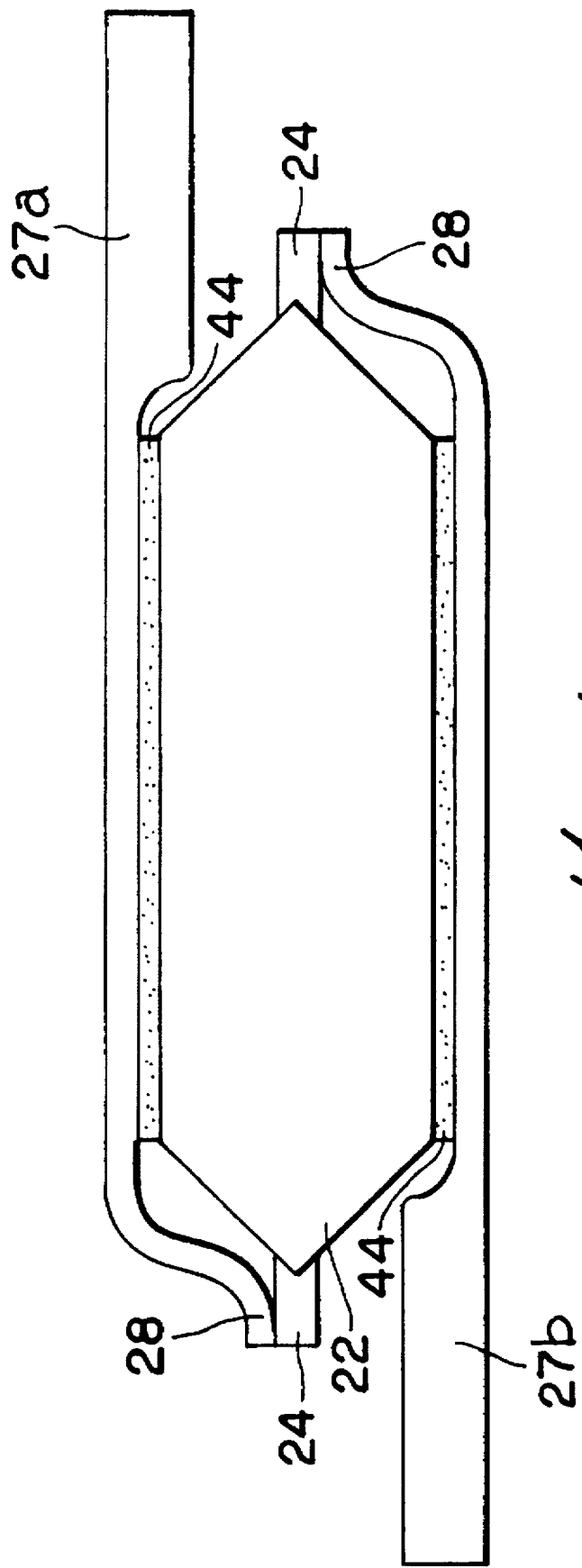
FIG. 10 is a schematic elevational view of FIG. 9 taken along section line 10—10.

Referring to FIG. 10, the embodiment of the present invention of FIG. 9 is illustrated in schematic elevational view. Lead flames 27a and 27b are laminated to the top and bottom major surfaces, respectively, of the package 22 by adhesive 44. Adhesive 44 may be, for example, a very thin layer of thermally conductive adhesive and may be applied at approximately 0.3 mils thickness. The adhesive 44 may also be cured to form an insulator as more fully explained below. Lead frame 27 may be etched thinner where it attaches to the major surface of the package 22. This results in a reduction in overall package thickness.

The lead frame 27 is in close thermal communication with a major surface of the package 22 to increase the thermal conductance of heat from the package 22. The metal of lead frame 27 is a very good conductor of heat and the more surface area of lead frame 27 that is in communication with the package 22, the better the heat flow therefrom. The above thermal conductance improvement applies equally well to the type 1 package 20 and lead frame 26 above.

Figure 13A:
Figure 13B:
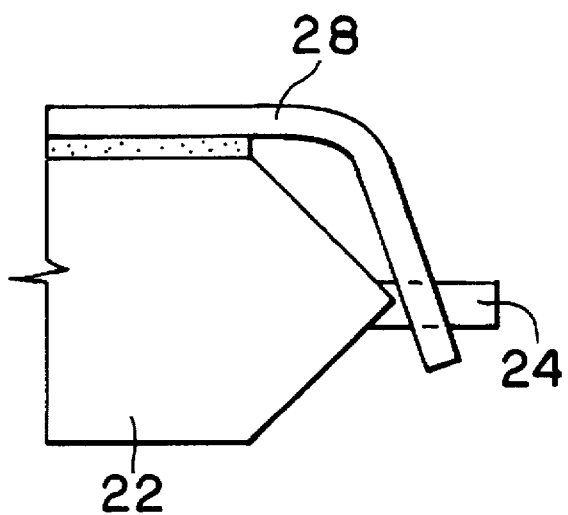
Figure 13C:
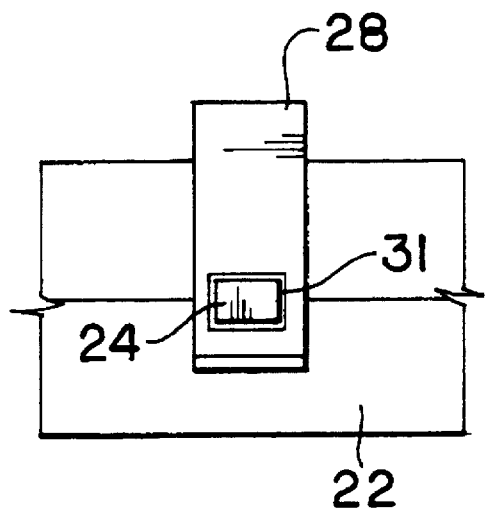

The conductors 28 of lead frame 27 may be electrically connected to TSOP connections 24 by soldering, thermal compression bonding or by any other appropriate means. TSOP connections 24 may be bent to conductors 28 or vice versa. Additionally, before electrical connections are made as described above, conductors 28 may use wing tabs 29 (FIGS. 11, 9c) or hook tabs 29a (FIG. 12) for wrapping around connections 24. Similarly, a slot 31 in lead frame conductors 28 (FIGS. 13, 9c) may be used to mechanically secure the conductors 28 to the conductions 24. The mechanical attachment means illustrated in FIGS. 12–13 enable the conductors 28 to be mechanically held to conductors 24 before soldering or other means of final electrical connection as is well known in the art.

FIG. 14 illustrates a schematic elevational view of an embodiment of the present invention illustrating a metal heat spreader/ground plane 46 laminated to the lead frame 27. The heat spreader 46 may be any heat conductive material such as copper and may be used as a ground plane for electrical noise reduction by connecting the ground plane 46 to electrical system ground by means of grounding connection 47. The heat spreader/ground plane 46 is attached to the lead frame 27 by adhesive 44. A second layer of adhesive 44 may be placed over the ground plane 46 to function as an insulator.

Referring now to FIGS. 15 and 16, a TSOP integrated circuit (package 20 or 22) is illustrated in schematic elevational view. The integrated circuit 22 of FIG. 15 is a TSOP which may be approximately 26 to 40 mils thick. Package encapsulation material may be lapped or ground off of the bottom of the package 22 at line 50 and off the top of the package 22 at line 52. This reduces the overall thickness of the package 22 so that when a lead frame 27 (FIG. 16) is laminated thereto, the overall thickness of the finished package including the lead frame does not increase over the original package thickness. Additionally, reducing the thickness of the package 22 improves the thermal conduction of the package 22 because the integrated circuit chip (not illustrated) within the package 22 is closer to the thermally conductive lead frame 27 (FIG. 16).

Figure 21:
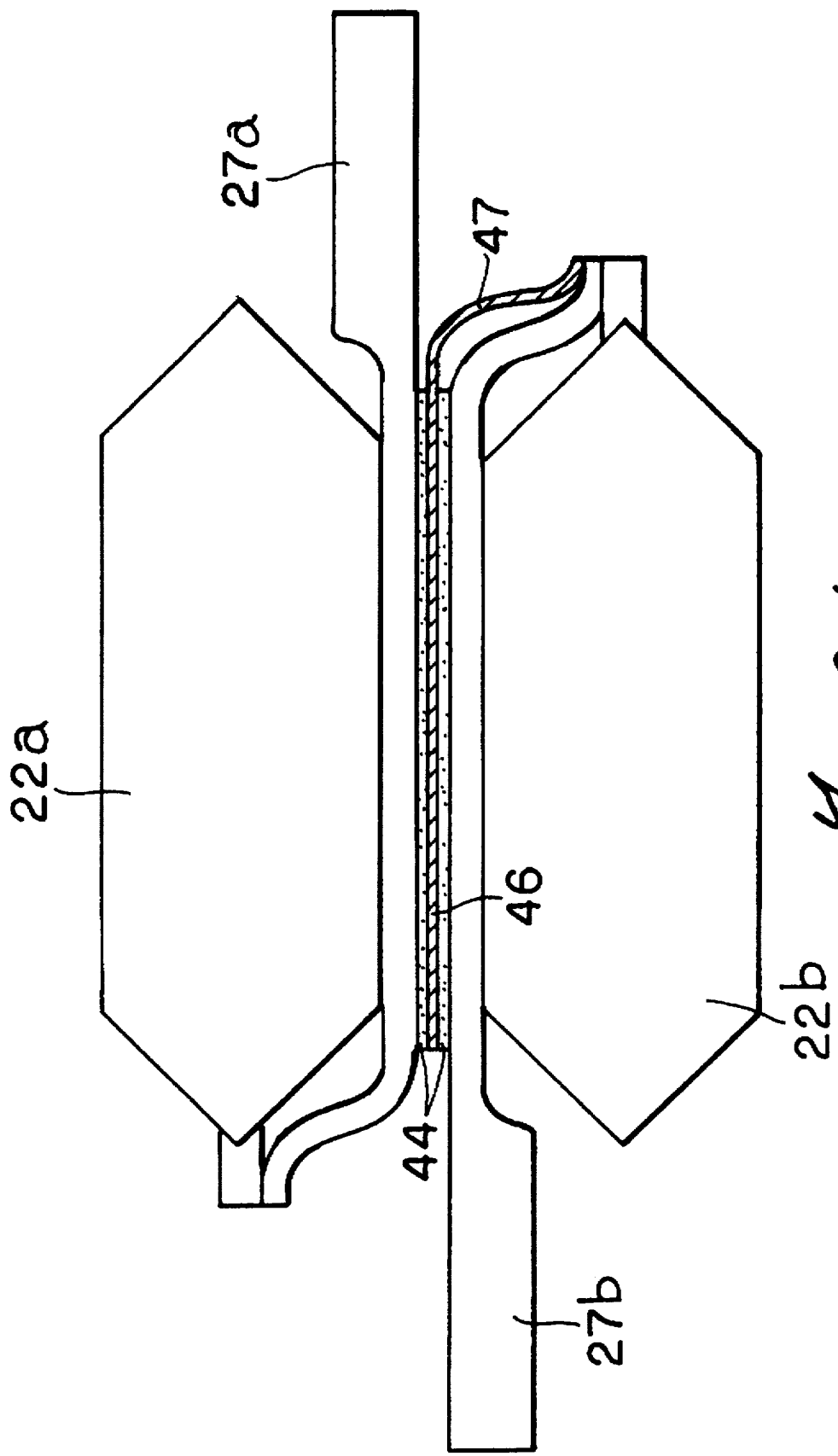
FIG. 21 is a partial schematic elevational view of an embodiment of the present invention illustrating stacked TSOPs having a crosstalk isolation ground plane between each lead frame of each respective package.

FIG. 17 illustrates a ground plane 46 laminated to lead frame 27b of an embodiment of the present invention illustrated in FIG. 10. By using a ground plane 46 and controlling the thickness of the adhesive/insulator 44a between the ground plane 46 and lead frame 27, an effective stripline circuit having low noise and constant impedance in a signal transmission system is achieved. Adhesive 44a over lead frame 27a or adhesive 44b over the ground plane 46 may be used as an insulator between stacked lead frame on packages (FIG. 21).

Alternatively, two ground planes 46, one above and one below a lead frame 27, each plane 46 separated from lead frame 27 by an adhesive layer 44 to form a microstrip system. Both stripline and microstrip configurations give superior heat conduction and improved high frequency signal integrity. Design of stripline and microstrip systems are well known in the art of microwave communications.

Figure 18B:
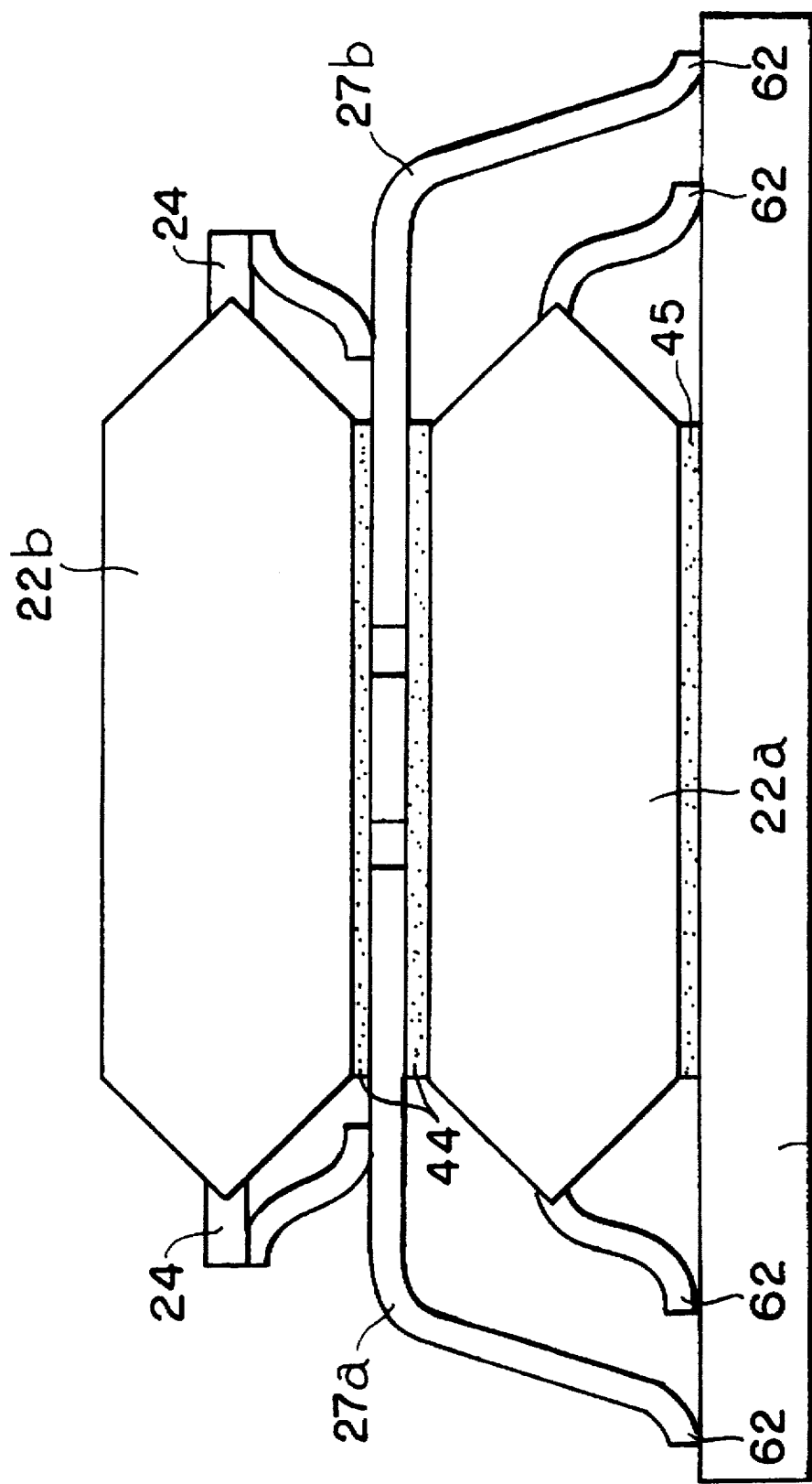

Referring now to FIGS. 18a and 18b, further embodiments of the present invention are illustrated in schematic elevational view. TSOP packages 22a and 22b are arranged in a two high configuration and attach to a printed circuit board 60. Package 22b may be a standard TSOP integrated circuit having lead frames 27a and 27b laminated thereto by adhesive 44. Package 22a is laminated to lead frame 27a by adhesive 44. Both packages 22a and 22b are in thermal communication with the lead frames 27. Package 22a may additionally be in thermal communication with the printed circuit board 60 by means of heat conductive grease 45 or adhesive 44 (not illustrated). Electrical connections 24 are connected to the lead frames 27 as mentioned above. The two high embodiment of FIG. 18 may be, surface mounted to printed circuit board 60 at connection points 62 by standard surface mount technology well known in the art.

Figure 19:
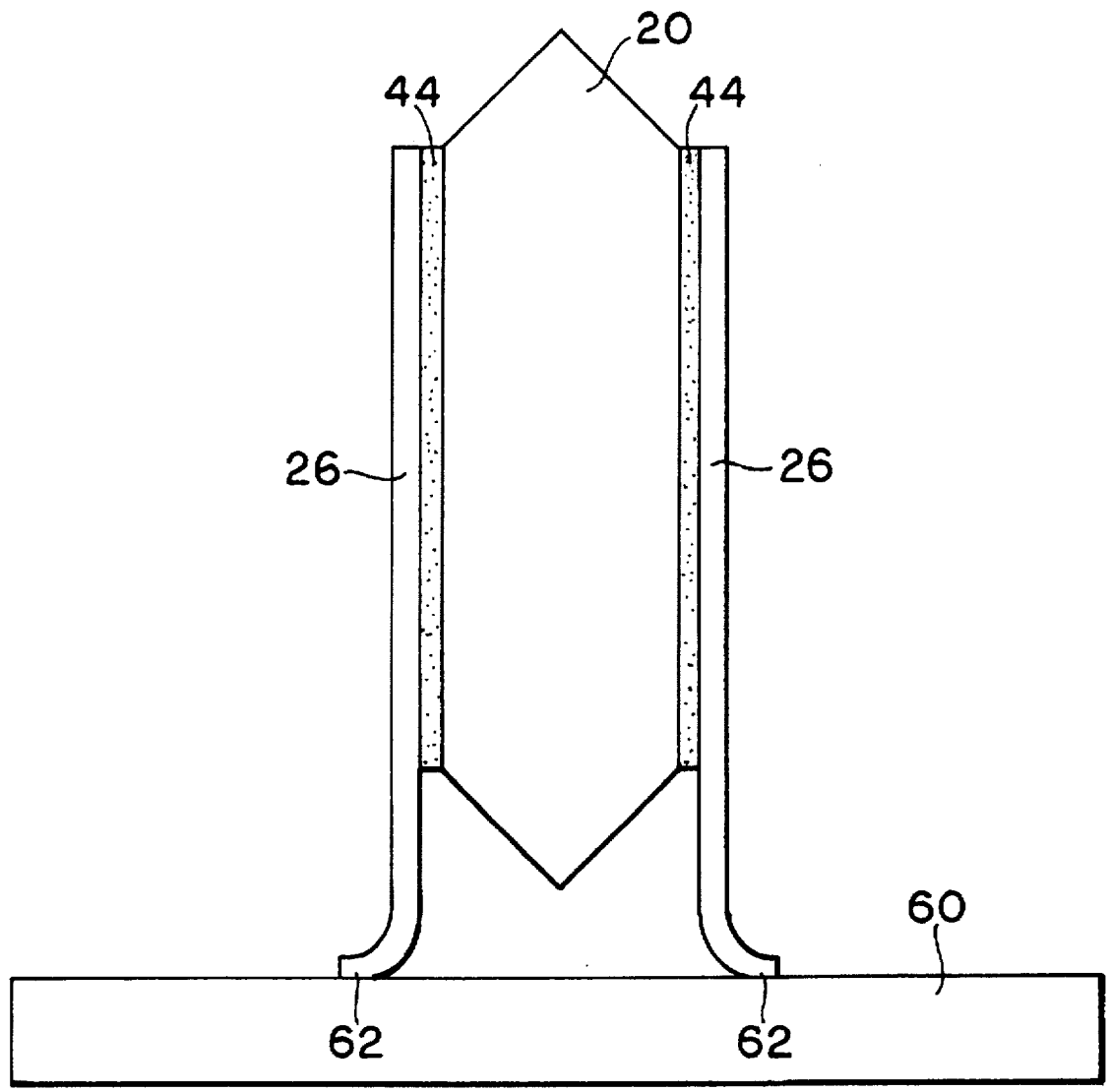
FIG. 19 is a schematic elevational view of a vertically oriented embodiment of the present invention connected to a printed circuit board.

Referring now to FIG. 19, an embodiment of the present invention is illustrated in schematic elevational view of a vertically oriented integrated circuit package 20 mounted to a printed circuit board 60. Package 20 may be, for example, a type 1 package having lead frames 26 arranged so that the package 22 is mounted perpendicular to the printed circuit board 60 and connected thereto by connections 62. Lead frames 26 are laminated to package 20 as described above.

Figure 20:
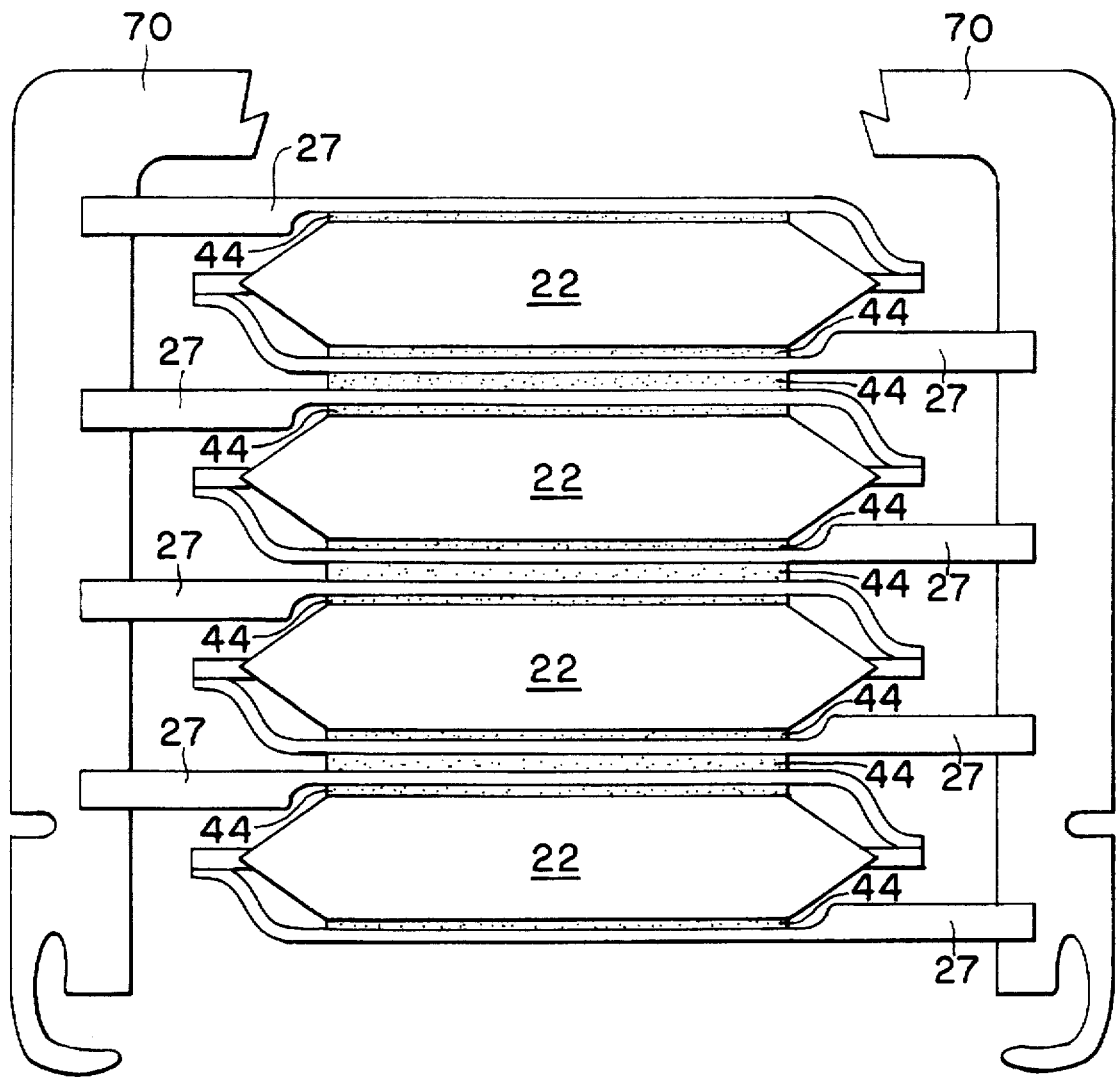
FIG. 20 is a schematic elevational view illustrating four TSOPs of the present invention stacked in a level II package configuration.

FIG. 20 is an embodiment of the present invention having four TSOP packages 22 stacked together and electrically and thermally interconnected through rails 70. Packages 22 are laminated to lead frames 27 and then the lead frames 27 are connected to the rails 70 by soldering, thermal compression bonding or any other suitable means. Many configurations of the embodiment illustrated in FIG. 20 are possible and two or more packages 22 may be effectively stacked in both vertical and horizontal configurations, as is more fully illustrated in co-pending U.S. patent application Ser. Nos. 07/561,417 and 07/884,066, filed Aug. 1, 1990 and May 15, 1992, respectively, both having the common assignee of the present invention and incorporated herein by reference for all purposes.

Close stacking of TSOP packages 22 with lead frames 27 attached thereto may cause crosstalk between different signals on the different lead frame 27 conductors 28. A ground plane 46 may be placed between the closely spaced lead frames 27 to substantially reduce signal crosstalk therebetween. FIG. 21 illustrates a schematic elevational view of such a ground plane 46 between packages 22a and 22b. Only one ground plane 46 is needed between each lead frame 27a and 27b. Adhesive 44 may be B-staged and used as both an insulator and adhesive for the ground plane 46. A plurality of packages may be stacked as illustrated in FIG. 20 using a ground plane 46 between each adjacent lead frame 27.

When the package 20 or 22 is lapped or ground ultra thin (FIG. 15), the package 20 or 22 may have a tendency to warp due to variations in temperature during fabrication and/or operation. Temperature may affect the shape of the over package because the thermal coefficient of expansion is different between the silicon chip contained within the encapsulation material of the package 20 or 22, and the lead frame 27.

Figure 22:
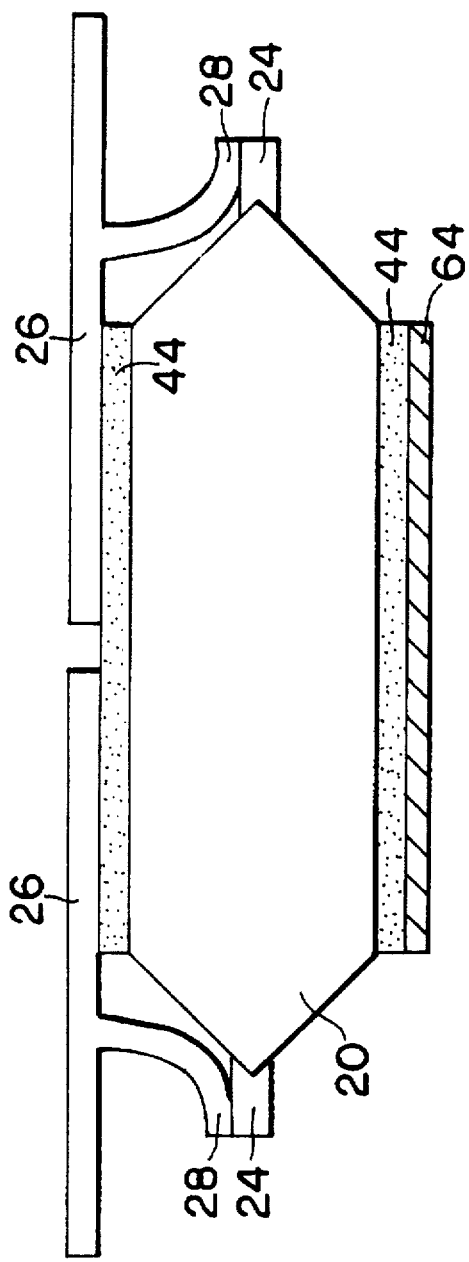
FIG. 22 is a schematic elevational view of an embodiment of the present invention including a stiffener element attached to a major face of a lapped or ground TSOP integrated circuit.

Referring now to FIG. 22, a stiffener 64 may be laminated to the package 20 to prevent warping of the package 20. Adhesive 44 may be used to laminate element 64 to the package 20 or 22. Element 64 may be, for example, metal such as kovar, invar coated with copper, or copper materials. For example, when package 20 is approximately 40 mils nominal thickness is laminated to a lead frame 26 of 3 mils or less in thickness at 175 degrees centigrade, at room temperature package 20 may warp approximately 0.5 mil. When lead frame 26 is thicker, 4–6 mils for example, then a stiffener 64 may be desired to reduce or prevent warpage of the package 20. The stiffener 64 may be 1–3 mils thick, the adhesive 44 that laminates the stiffener 64 to package 20 may be 0.3 mils thick and an insulating polymer coating (not illustrated) over the stiffener 64 may be 1 mil thick. The stiffener 64 may also serve as a heat spreader and ground plane.

Figure 23:
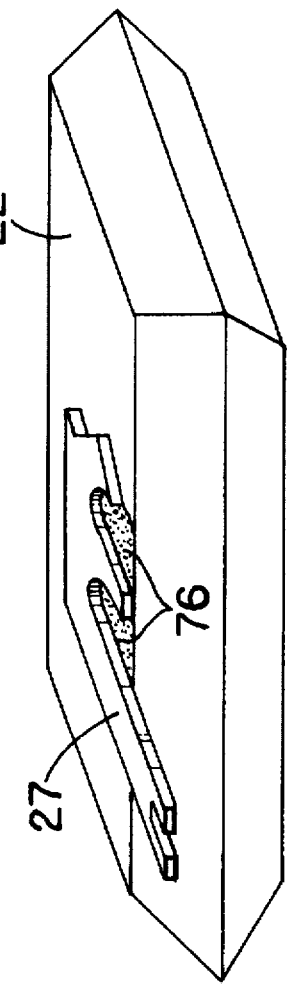
FIG. 23 is a partial schematic plan view of a lead frame laminated to a package and having polymer dams between the lead frame leads for preventing solder bridges therebetween.
Figure 24:
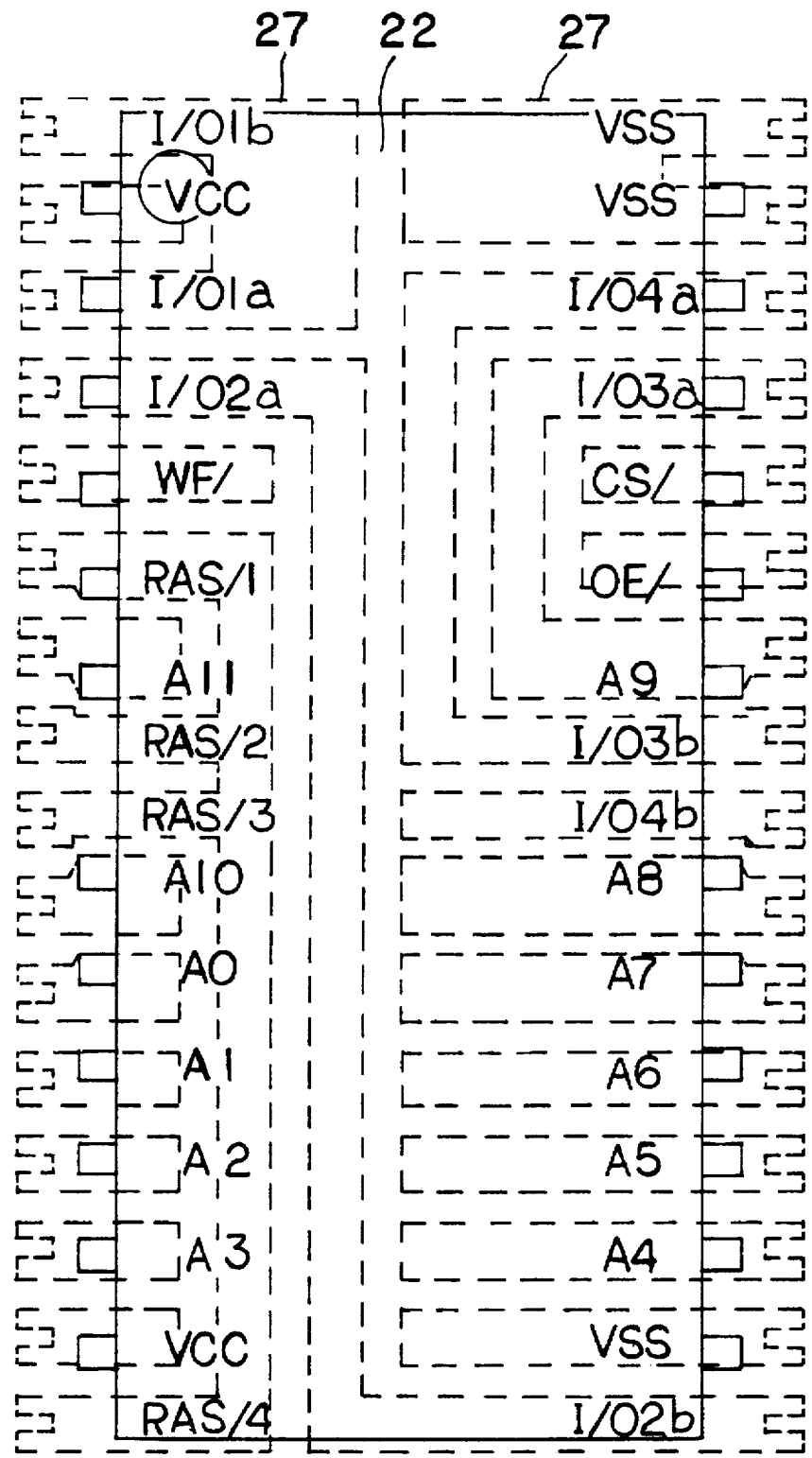
FIG. 24 is a schematic plan view of a lead frame on a type 2 TSOP package.

Referring now to FIG. 23, a partial schematic plan view illustrates lead frame 27 conductors laminated to package 22 with polymer adhesive dams 76 therebetween. The dams 76 may be used to prevent solder from bridging between the lead frame 27 conductors during soldering. FIG. 24 illustrates a single lead frame 27 laminated to package 22 and having all conductors on one face of the package 22.

Figure 25:
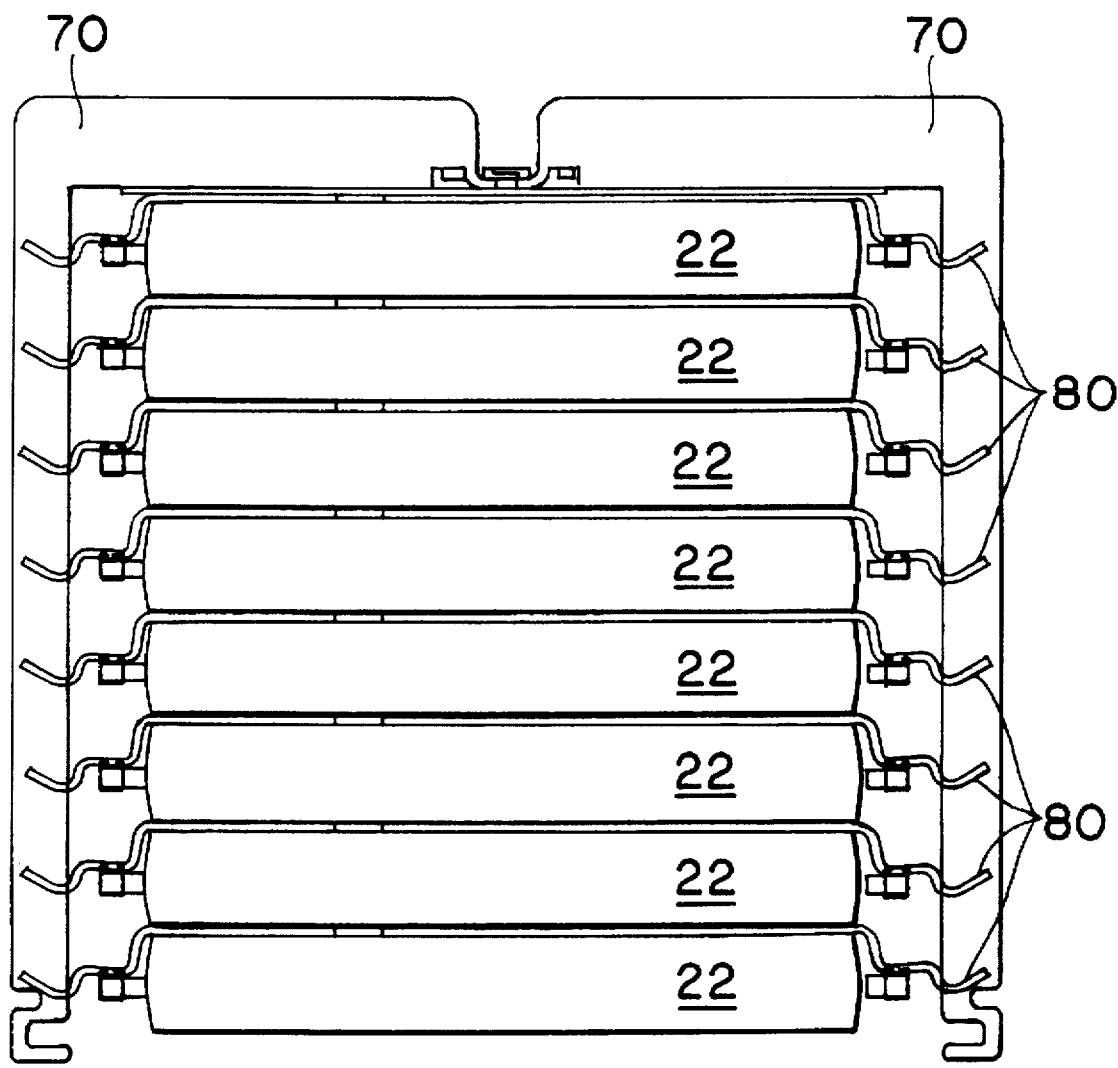
FIG. 25 is an schematic elevational view of a level 2 stacked embodiment of the present invention.
Figure 26:
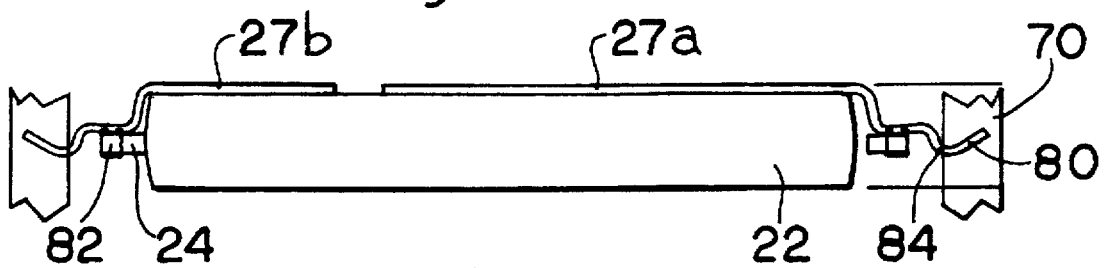
FIG. 26 is a partial schematic view of one TSOP package of the embodiment of FIG. 25.

Referring to FIGS. 25 and 26, schematic and partial schematic plans views, respectively, of an embodiment of the present invention having stress relief is illustrated. FIG. 26 illustrates one lead on frame package of FIG. 25. A lead frame 27 such as illustrated in FIG. 24 is laminated to package 22 and is connected to connections 24 at connection points 82 by, for example, thermal compression bonding or soldering. The embodiment of FIG. 25 uses stress relief connections 80 to prevent excessive mechanical stress on the package 22 when the connections 80 are attached to the rails 70 or when operated over a wide temperature range that would overwise cause mechanical stresses on the package 22 due to thermal expansion and contraction. Connection 80 has a flexible offset 84 that flexes and allows the package 22 and lead frame 27 to expand and contract within the rails 70 without creating excessive mechanical stress.

Figure 27:
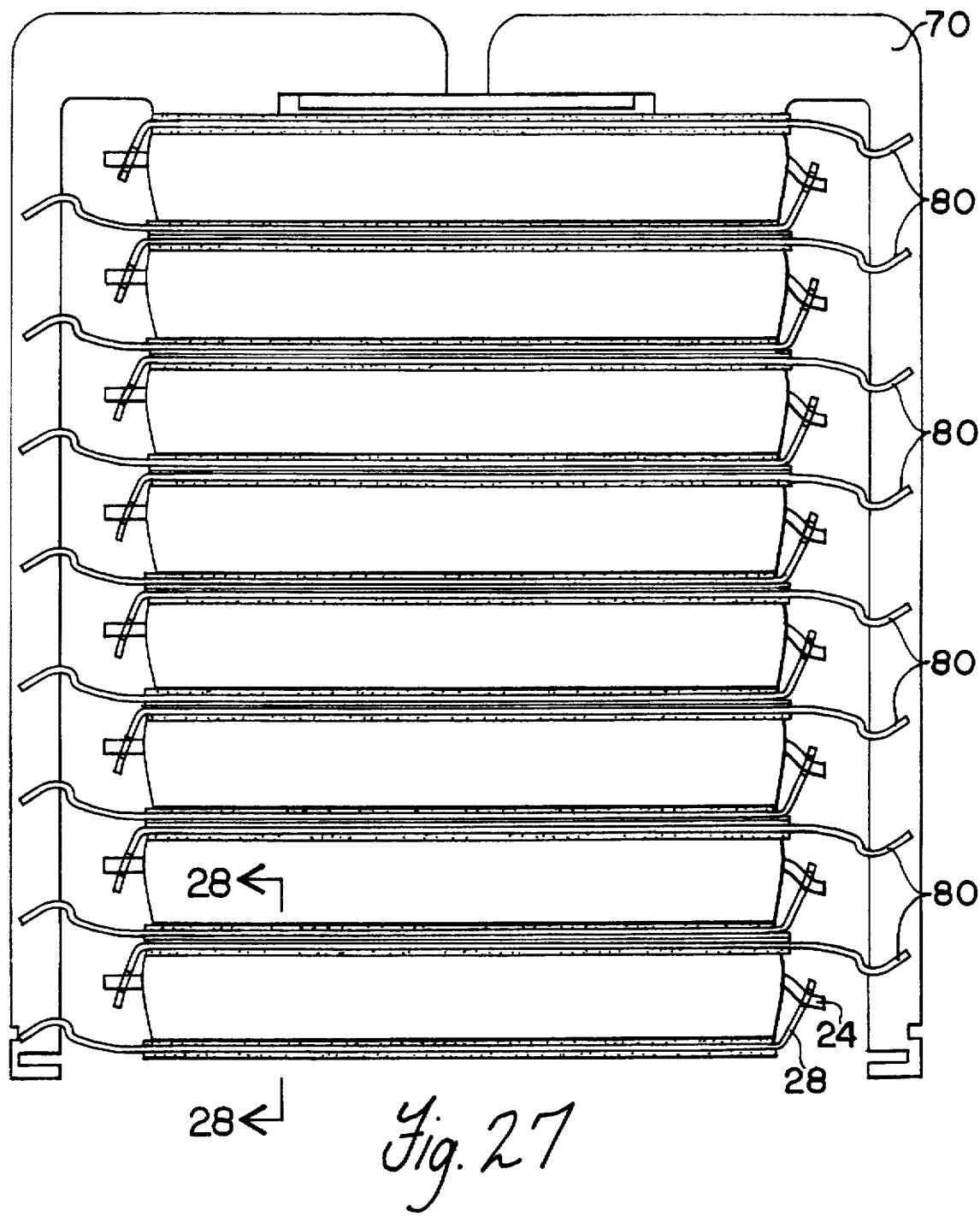
FIG. 27 is an schematic elevational view of yet another level 2 stacked embodiment of the present invention.
Figure 28:
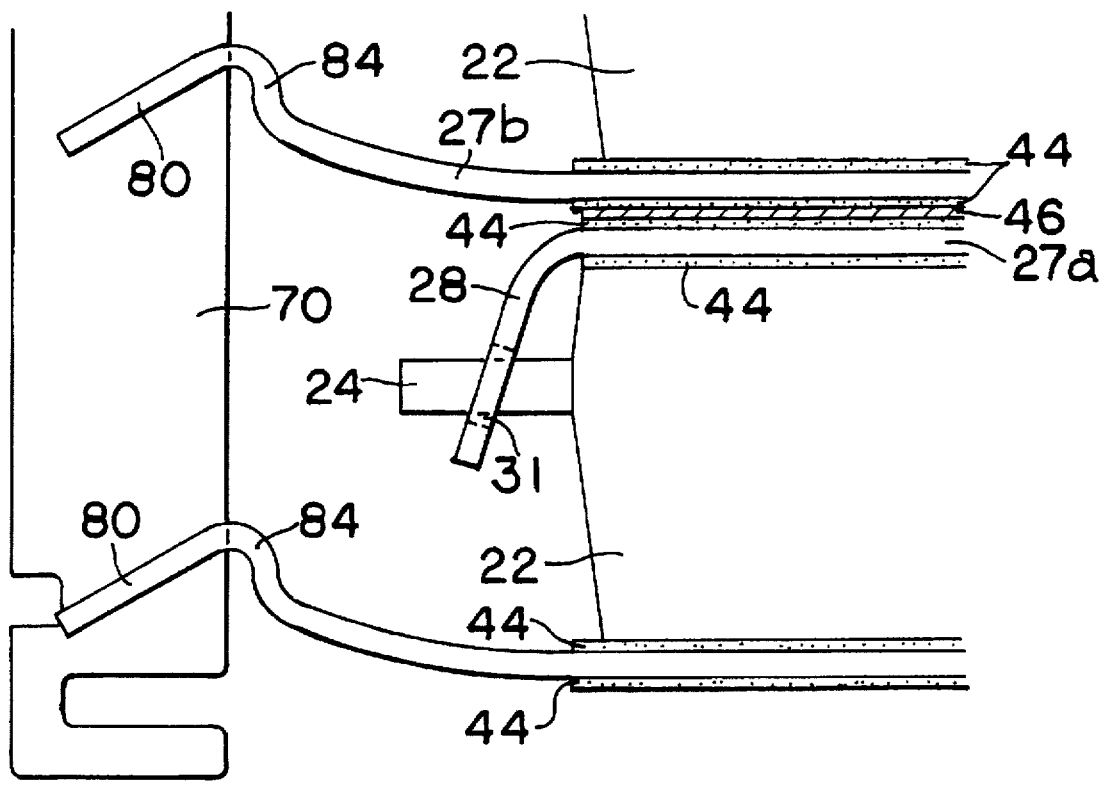
FIG. 28 is a partial schematic elevational view taken along line 28—28 of FIG. 27 illustrating the rail and lead frame connections.
Figure 29:
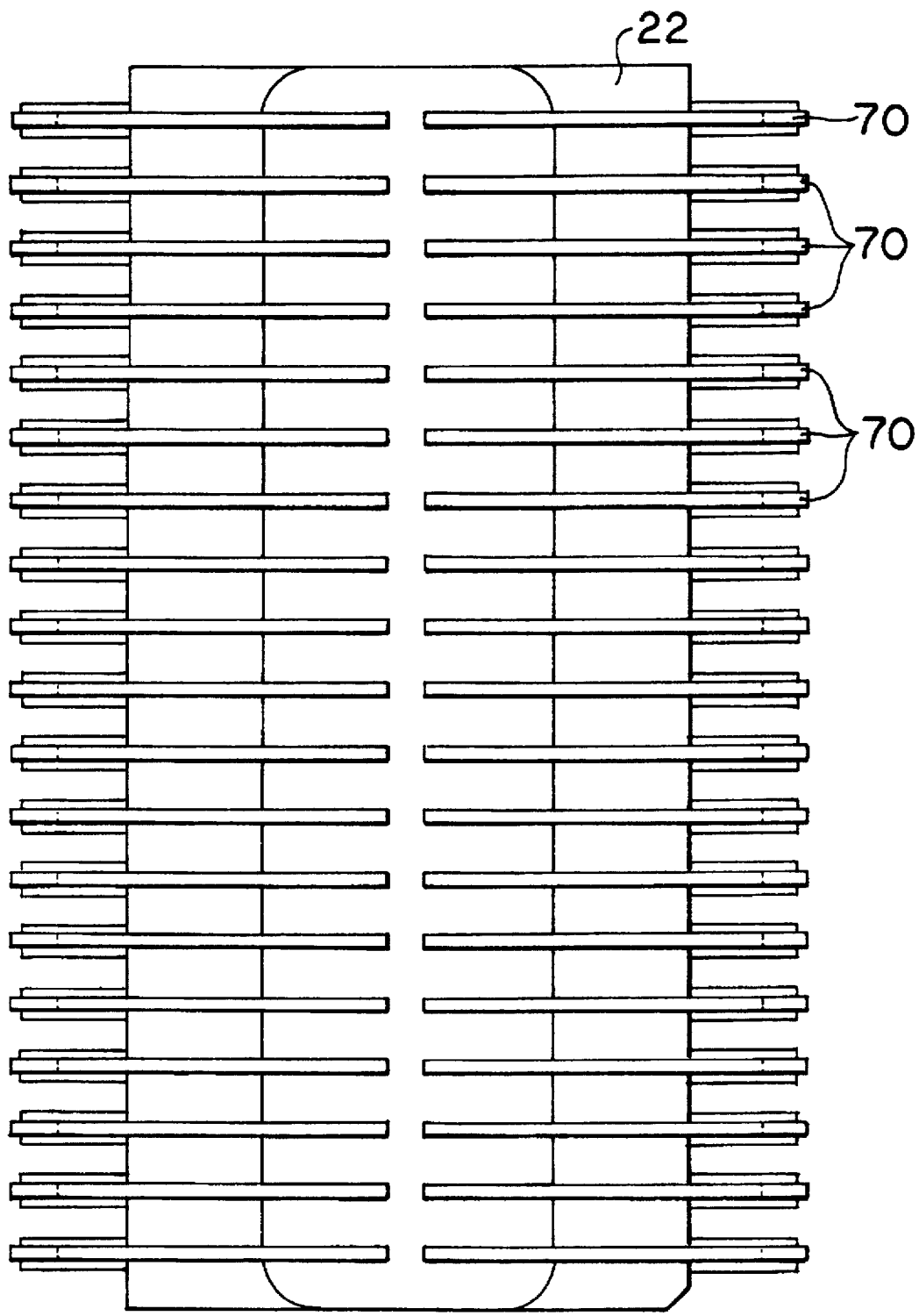
FIG. 29 is a schematic plan view of the embodiment illustrated in FIG. 27.
Figure 30:
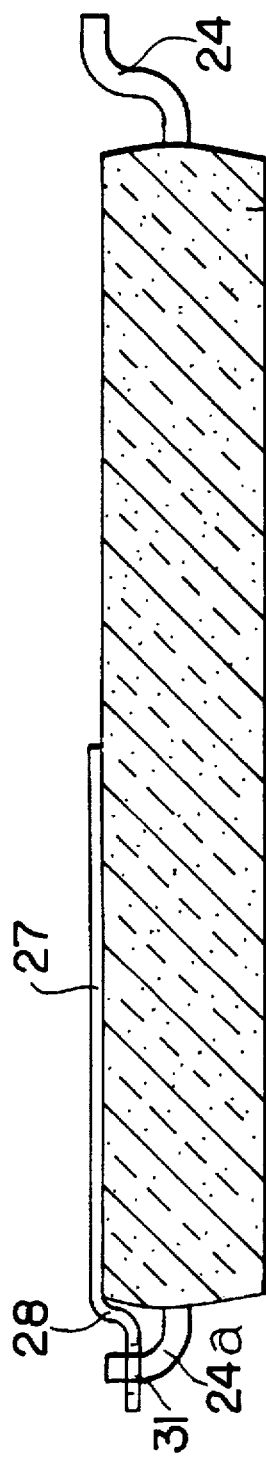
FIG. 30 is a schematic cross section elevational view of yet another embodiment of the present invention illustrating connection of the lead frame to the TSOP conductor.

Referring now to FIGS. 27, 28 and 29, another embodiment of the present invention is illustrated in schematic elevational, partial elevational and plan views, respectively. The conductors 28 attach to connections 24 by bending the conductors 28 where the connections 24 pass through slots 31 and then electrical connection is made thereto. FIG. 28 illustrates ground plane 46 between lead frames 27a and 27b. The ground plane 46 is insulated by means of adhesives 44.

Figure 31:
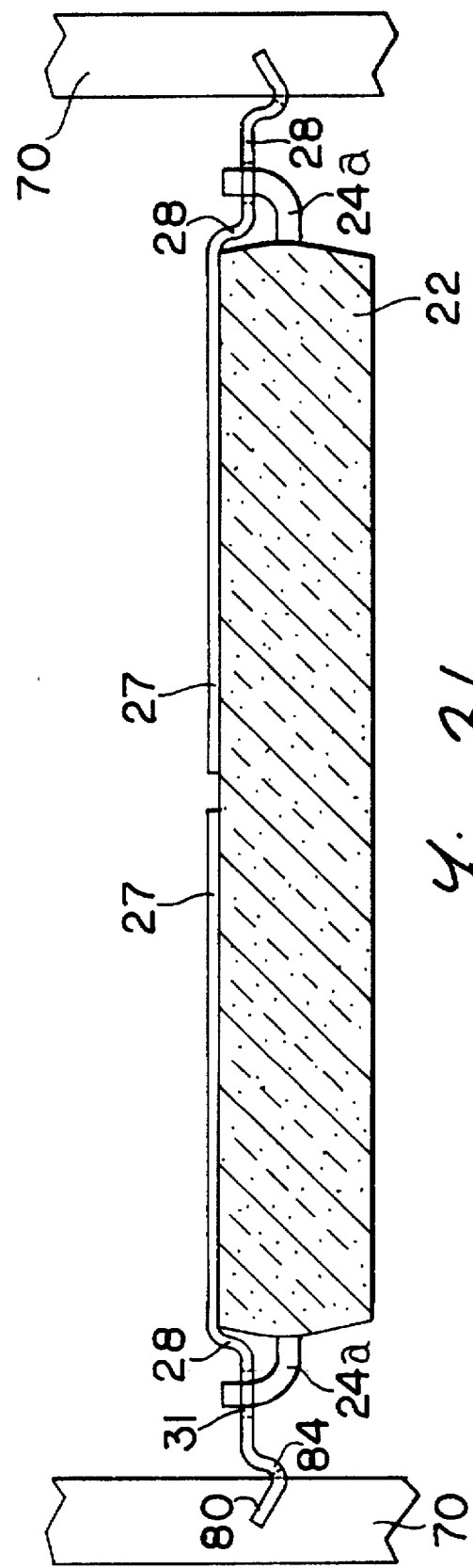
FIG. 31 is a schematic cross section elevational view of the embodiment of FIG. 30 connected to level 2 rails.
Figure 32:
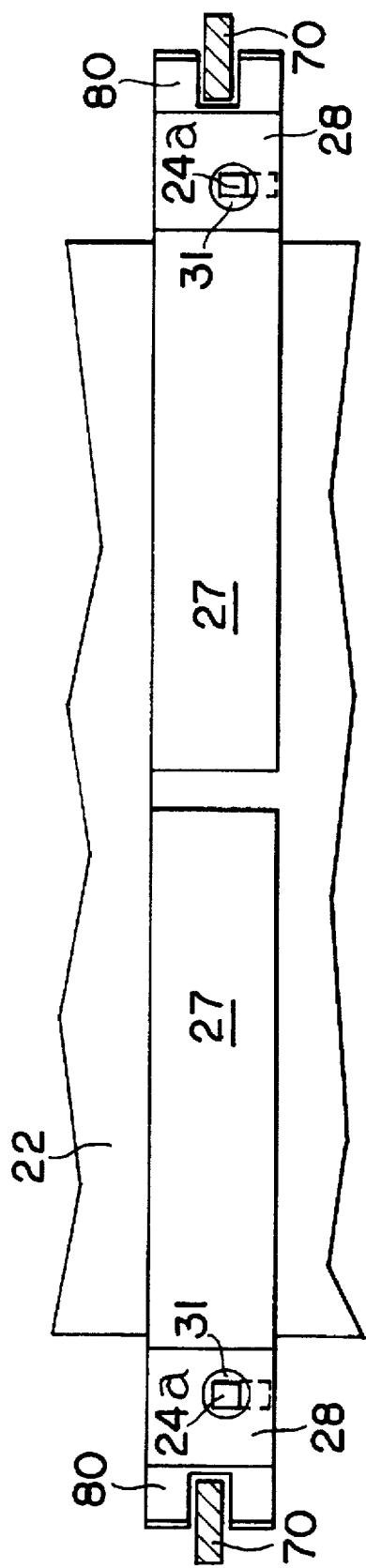
FIGS. 32 and 33 are schematic plan views of the embodiment of FIGS. 30 and 31.
Figure 33:
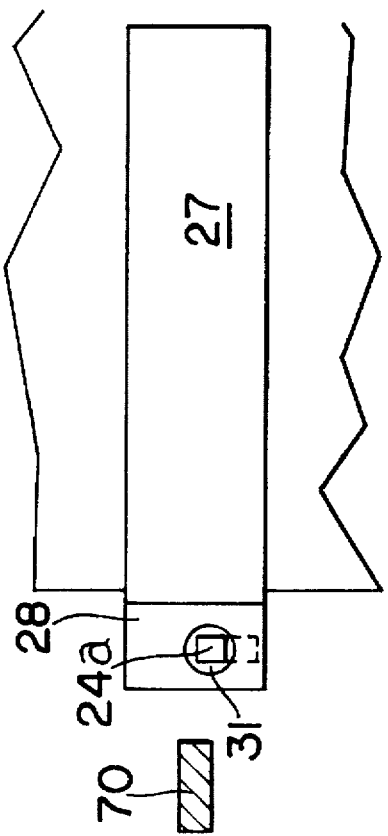

Referring now to FIGS. 30–33, yet another embodiment of the present invention is illustrated in schematic cross-section elevational and plan views. In this embodiment, connector 24a is formed and cut into connector 24. Connection 24a is adapted to fit through slot 31 in lead frame 27 conductors 28 and then electrically connected as mentioned above. FIG. 31 illustrates connection of a level 1 package to rails 70 using stress relief connections 80. FIGS. 32 and 33 illustrate selective connection to the rails 70. The connection 80 attaches to rail 70 in FIG. 32 and does not attach in FIG. 33. Selective connection allows package selection when commonly stacked packages have common address and data lines and can only be selected by means of a chip select.

Figure 34:
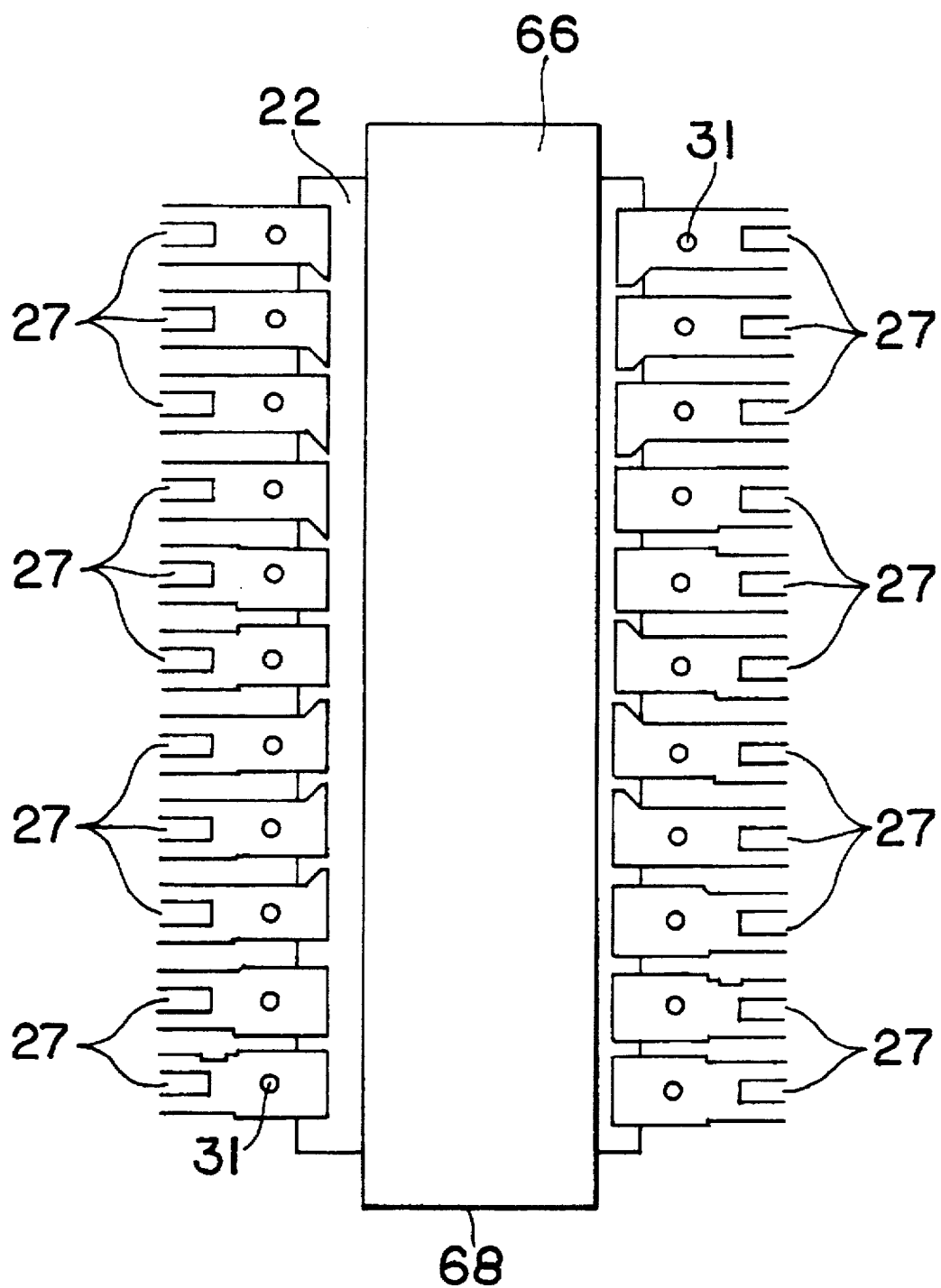
FIG. 34 is a schematic plan view of an embodiment of the present invention illustrating a copper heat spreader/conductor laminated to a type 2 TSOP package.

Referring now to FIG. 34, a heat spreader embodiment of the present invention is illustrated in schematic plan view. A thermally conductive heat spreader 66 formed of copper, for example, is laminated to a major surface of package 22. The heat that is conducted from the package 22 through heat spreader 66 is then removed through heat transfer connection at end 68 of spreader 66 to a system heat dissipation means (not illustrated). The lead frame 27, in this embodiment is used mostly for electrical connections and extends only over a portion of the package 22. Connection between lead frame 27 and connections 24 are at slot 31 as described above. The embodiment illustrated in FIG. 34 may be stacked into level 2 packages as previously described.

The foregoing disclosure and description of the invention are illustrative and explanatory of the preferred embodiments, and changes in the size, shape, materials and individual components, circuit elements, connections and construction may be made without departing from the spirit of the invention.

What is claimed is:

1. A method of forming a warp-resistant integrated circuit package, comprising the steps of:

providing an integrated circuit package, said package having an upper and a lower major exterior planar surface, said package including an integrated circuit element at least substantially encapsulated within said package by an encapsulating material;

mounting a stiffener to said upper major exterior planar surface of said package, wherein said upper major exterior planar surface comprises encapsulation material; and reducing the height of said package.

2. The method of claim 1, wherein said step of reducing is accomplished by lapping said lower major surface of said package.

3. The method of claim 1, wherein said step of reducing is accomplished by grinding said lower major surface of said package.

4. The method of claim 1, wherein said stiffener comprises a metal.

5. The method of claim 1, wherein said step of mounting includes the step of laminating said stiffener to said upper major surface of said package using an adhesive.

6. The method of claim 5, wherein said adhesive is a thermally conductive adhesive.

7. The method of claim 5, wherein said adhesive is a β-staged adhesive.

8. The method of claim 5, wherein said adhesive is cured to form an insulator.

* * * * *

UNITED STATES PATENT AND TRADEMARK OFFICE
CERTIFICATE OF CORRECTION

PATENT NO. : 5,631,193
DATED : May 20, 1997
INVENTOR(S) : Carmen D. Burns

It is certified that error appears in the above-indentified patent and that said Letters Patent is hereby corrected as shown below:

On the title page, item [54] and Col. 1, should read as follows:

"Warp-Resistant Integrated Circuit Package and Method."

At Col. 4, line 28, delete "rail" and insert -- mil -- .
At Col. 5, line 22, delete "flames" and insert -- frames -- .
At Col. 6, line 16, delete "has/connection" and insert -- has connections -- .
At Col. 7, line 41, delete "flames" and insert -- frames -- .
At Col. 7, line 64, delete "FIGS. 119c" and insert -- FIG. 11 -- .
At Col. 7, line 66, delete "FIGS. 139c" and insert -- FIG. 13 -- .
At Col. 8, line 1, delete "conductions" and insert -- connections -- .
At Col. 10, line 15, delete "overwise" and insert -- otherwise -- .
At Col. 11, line 3, delete "off" and insert -- of -- .

Signed and Sealed this

Twenty-third Day of September, 1997

Attest:

BRUCE LEHMAN

*Attesting Officer*  Commissioner of Patents and Trademarks